United States Patent
Kirsch et al.

(10) Patent No.: US 12,035,546 B2
(45) Date of Patent: Jul. 9, 2024

(54) METHOD FOR PRODUCING AN ELECTRONIC COMPONENT WHICH INCLUDES A SELF-ASSEMBLED MONOLAYER

(71) Applicant: MERCK PATENT GMBH, Darmstadt (DE)

(72) Inventors: Peer Kirsch, Seeheim-Jugenheim (DE); Sebastian Resch, Mainz (DE); Henning Seim, Darmstadt (DE); Marc Tornow, Munich (DE); Takuya Kamiyama, Munich (DE); Gerd-Volker Roeschenthaler, Bremen (DE); Romana Pajkert, Bremen (DE); Jacob Woodruff, Philadelphia, PA (US); Charith Nanayakkara, Philadelphia, PA (US)

(73) Assignee: MERCK PATENT GMBH, Darmstadt (DE)

( * ) Notice: Subject to any disclaimer, the term of this patent is extended or adjusted under 35 U.S.C. 154(b) by 827 days.

(21) Appl. No.: 17/251,669

(22) PCT Filed: Jun. 11, 2019

(86) PCT No.: PCT/EP2019/065160
§ 371 (c)(1),
(2) Date: Dec. 11, 2020

(87) PCT Pub. No.: WO2019/238649
PCT Pub. Date: Dec. 19, 2019

(65) Prior Publication Data
US 2021/0257569 A1    Aug. 19, 2021

(30) Foreign Application Priority Data

Jun. 14, 2018 (DE) .......................... 102018004733.5

(51) Int. Cl.
   *H10K 19/20*      (2023.01)
   *H10K 19/00*      (2023.01)

(52) U.S. Cl.
   CPC ................................ *H10K 19/202* (2023.02)

(58) Field of Classification Search
   CPC ........................... H10K 19/202; H10K 85/731
   See application file for complete search history.

(56) References Cited

U.S. PATENT DOCUMENTS

| | | |
|---|---|---|
| 5,189,030 A | 2/1993 | Maier |
| 9,079,930 B2 | 7/2015 | Dang et al. |
| (Continued) | | |

FOREIGN PATENT DOCUMENTS

| | | |
|---|---|---|
| DE | 102015000120 A1 | 7/2016 |
| DE | 102017005884 A1 | 1/2018 |
| (Continued) | | |

OTHER PUBLICATIONS

Machine translation of the written opinion (ETWOS) (Year: 0000).*

(Continued)

*Primary Examiner* — Amanda C. Walke
(74) *Attorney, Agent, or Firm* — Millen, White, Zelano & Branigan, P.C.; Brion P. Heaney

(57) ABSTRACT

The invention relates to a process for the production of an electronic component comprising a self-assembled monolayer (SAM) using compounds of the formula I $$R^1\text{-}(A^1\text{-}Z^1)_r\text{—}(B^1)_n\text{—}(Z^2\text{-}A^2)_s\text{-Sp-G} \qquad (I)$$

in which the groups occurring have the meanings defined in Claim 1; the present invention furthermore relates to the use of the components in electronic switching elements and to compounds for the production of the SAM.

20 Claims, 2 Drawing Sheets

(56) References Cited

U.S. PATENT DOCUMENTS

| | | | |
|---|---|---|---|
| 9,172,053 | B2 | 10/2015 | Hayashi et al. |
| 9,234,136 | B2 | 1/2016 | Archetti et al. |
| 10,741,778 | B2 | 8/2020 | Kirsch et al. |
| 10,896,942 | B2 | 1/2021 | Arai et al. |
| 11,522,141 | B2 | 12/2022 | Kirsch et al. |
| 2005/0099209 | A1 | 5/2005 | Luyken et al. |
| 2008/0012009 | A1 | 1/2008 | Hashizume et al. |
| 2009/0131384 | A1 | 5/2009 | Uysal et al. |
| 2012/0184510 | A1 | 7/2012 | Colburn et al. |
| 2013/0129922 | A1* | 5/2013 | Sasagawa ......... H01L 21/67069 427/248.1 |
| 2014/0008601 | A1 | 1/2014 | Nishizawa et al. |
| 2014/0009379 | A1* | 1/2014 | Giri .................. B81B 3/0005 359/290 |
| 2014/0141564 | A1 | 5/2014 | Wang et al. |
| 2016/0060530 | A1 | 3/2016 | Archetti et al. |
| 2016/0355405 | A1 | 12/2016 | Yoon et al. |
| 2017/0298166 | A1 | 10/2017 | Pugh et al. |
| 2019/0312216 | A1 | 10/2019 | Kirsch et al. |

FOREIGN PATENT DOCUMENTS

| | | |
|---|---|---|
| EP | 0207890 B1 | 3/1990 |
| EP | 1879240 A2 | 1/2008 |
| EP | 3270664 A1 | 1/2018 |
| JP | 2000192046 A | 7/2000 |
| JP | 2007177051 A | 7/2007 |
| TW | 201811718 A | 4/2018 |
| WO | 9828311 A1 | 7/1998 |
| WO | 12127542 A1 | 9/2012 |
| WO | 13004372 A1 | 1/2013 |
| WO | 13043624 A1 | 3/2013 |
| WO | 14169988 A1 | 10/2014 |
| WO | 18007337 A2 | 1/2018 |

OTHER PUBLICATIONS

Wang et al., "Direct regioselective phosphonation . . . " Chemical Communications 2014, 50, 92, 14409-14411.
Schreiber: "Structure and growth of self-assembling monlayers" Progress in Surface Science 2000_65_5-8_ 151-256.
Liu et al., "Conductivity switching and memory effect in polymer brushes . . . " Synthetic Metals 2012, 162, 13, 1059-1064.
Yoon: "The rate of charge Tunneling . . . " J. Am. Chem. Soc. 136 (2014) 16-19.
International Search report PCT/EP2019/065160 dated Oct. 1, 2019 (pp. 1-3).
Office Action in corresponding Singapore application 11202012423X dated Oct. 20, 2022 (pp. 1-2) and written Opinion pp. (1-6).
Queffélec et al., 'Surface Modification Using Phosphonic Acids and Esters', Chemical Reviews 2012, 112, 7, 3777-3807.
English translation of Office action in corresponding ROC (Taiwan) Patent Application No. 108120512 (pp. 1-4).
Office Action in corresponding German application 102018004733. 5dated Dec. 12, 2021 (pp. 1-5).
Office Action in corresponding Chinese Patent Application for Invention No. 201980038244.X dated Dec. 1, 2023 (pp. 1-14) and English translation thereof (pp. 1-13).

* cited by examiner

METHOD FOR PRODUCING AN ELECTRONIC COMPONENT WHICH INCLUDES A SELF-ASSEMBLED MONOLAYER

The invention relates to a process for the production of an electronic component comprising a self-assembled monolayer (SAM) using mesogenic compounds containing a spacer group and an anchor group, where the anchor group is an ester derivative of secondary or tertiary alcohols; the present invention furthermore relates to the use of the components in electronic switching elements and to compounds for the production of the SAM.

Self-assembled monolayers are known to the person skilled in the art (F. Schreiber: "Structure and growth of self-assembling monolayers", Progress in Surface Science, Oxford, GB, Vol. 65, No. 5-8, 1 Nov. 2000, pages 151-256) and serve, for example, for the modification of electrode surfaces in organic electronics.

In computer technology, storage media are required which allow rapid writing and reading access to information stored therein. Solid-state memories or semiconductor memories allow particularly fast and reliable storage media to be achieved, since absolutely no moving parts are necessary. At present, use is mainly made of dynamic random access memory (DRAM). DRAM allows rapid access to the stored information, but this information has to be refreshed regularly, meaning that the stored information is lost when the power supply is switched off.

The prior art also discloses non-volatile semiconductor memories, such as flash memory or magnetoresistive random access memory (MRAM), in which the information is retained even after the power supply has been switched off. A disadvantage of flash memory is that writing access takes place comparatively slowly and the memory cells of the flash memory cannot be erased ad infinitum. The lifetime of flash memory is typically limited to a maximum of one million read/write cycles. MRAM can be used in a similar way to DRAM and has a long lifetime, but this type of memory has not been able to establish itself owing to the difficult production process.

A further alternative is memory which works on the basis of memristors. The term memristor is a contraction of the words "memory" and "resistor" and denotes a component which is able to change its electrical resistance reproducibly between high and low electrical resistance. The respective state (high resistance or low resistance) is retained even without a supply voltage, meaning that non-volatile memories can be achieved with memristors.

An important alternative application of electrically switchable components arises for the area of neuromorphic or synaptic computing. In computer architectures pursued therein, the information is no longer intended to be processed sequentially in a classical manner. Instead, the aim is to build up the circuits in a highly three-dimensionally interlinked manner in order to be able to achieve information processing analogous to the brain. In artificial neuronal networks of this type, the biological connections between nerve cells (synapses) are then represented by the memristive switching elements. Under certain circumstances, additional intermediate states (between the digital states "1" and "0") may also be of particular benefit here.

WO 2012/127542 A1 and US 2014/008601 A1, for example, disclose organic molecular memories which have two electrodes and an active region which is arranged between the two electrodes. The active region has a molecular layer of electrically conductive aromatic alkynes, whose conductivity can be modified under the influence of an electric field. Similar components based on redox-active bipyridinium compounds are proposed in US 2005/0099209 A1.

The known memories based on a change in conductivity or resistance have the disadvantage that the free-radical intermediates formed by the flow of current through the molecules of the monolayer are in principle susceptible to degradation processes, which has an adverse effect on the lifetime of the components.

Angew. Chem. Int. Ed. 51 (2012), 4658 (H. J. Yoon et al.) and J. Am. Chem. Soc. 136 (2014) 16-19 (H. J. Yoon et al.) describe arrangements in which the electronic potential is measured via monolayers of alkyl compounds containing polar end groups. Suitability of such layers for use in switching elements of memristive electronic components cannot be derived therefrom; mesogenic compounds are neither mentioned therein nor is their suitability suggested.

DE102015000120A1 discloses electronic components which are suitable for use in memristive devices. The components contain a self-assembled monolayer of molecules which are able to reorient in an electric field.

An important class of substances which can be aligned in an electric field are mesogenic compounds. Mesogenic compounds are known from the prior art and are compounds which contain one or more mesogenic groups. A mesogenic group is the part of a molecule which, due to the anisotropy of its attractive and repulsive interactions, makes a significant contribution to low-molecular-weight substances forming a liquid-crystalline (LC) mesophase (C. Tschierske, G. Pelzl, S. Diele, Angew. Chem. 2004, 116, 6340-6368). The property that mesogenic compounds which carry polar substituents can be aligned and reoriented in an electric field is utilised in practice in liquid-crystal displays (Klasen-Memmer, M., and Hirschmann, H., 2014. Nematic Liquid Crystals for Display Applications. Handbook of Liquid Crystals. 3:11:4:1-25.)

Mesogenic compounds containing a terminal polar anchor group are likewise known in principle from the prior art. JP 2007 177051 A describes mesogenic compounds having positive dielectric anisotropy which are proposed for the derivatisation of iron oxide nanoparticles; the bonding to the particles takes place here through phosphate, phosphonate or carboxylate groups located at the end of the side chain. WO 2013/004372 A1 and WO 2014/169988 A1 disclose mesogenic compounds which carry terminal hydroxyl groups and serve for the derivatisation of substrates for liquid-crystal displays with the aim of homeotropic alignment of the liquid crystal. A corresponding use of dielectrically neutral and positive mesogenic compounds containing polar anchor groups is disclosed in JP2005/002164 A.

The processes described in the above-mentioned DE102015000120A1 for the production of SAMs are dip coating or the process known as the TBAG method, in which the solvent containing the compound to be applied is slowly evaporated (see E. L. Hanson et al., J. Am. Chem. Soc. 2003, 125, 16074-16080). These lengthy processes are not very suitable for commercial use. Industrially usable processes are, in particular, spin coating, furthermore spray coating, slot-die coating, and conventional printing processes, such as, for example, ink-jet printing, screen printing, microcontact stamp printing, and in addition deposition from the gas phase. In particular on use of monolayer-forming compounds which contain free acid groups as anchor groups, the problem arises that they are only sufficiently soluble in highly polar solvents, such as, for example, THF, ethanol or isopropanol. These solvents compete with the monolayer-forming compounds for bonding to the substrates and thus reduce the quality of the monolayers.

The choice of industrially usable solvents for the above-mentioned processes is limited. Examples of such solvents are non-polar solvents, such as hydrocarbons (decalin, xylene), halogenated hydrocarbons (chlorobenzene, trichloroethylene, Solkan-365 (HFC-365mfc, 1,1,1,3,3-pentafluorobutane), or weakly polar esters, ethers and ketones (propylene glycol monomethyl ether acetate (PGMEA), propylene glycol monomethyl ether (PGME), methyl amyl ketone (MAK), ethyl acetate, methyl tert-butyl ether (MTBE), cyclohexanone). The disadvantage of these solvents is the poor solubility of compounds from the prior art for the production of SAMs, particularly in the case of compounds containing strongly polar, acidic anchor groups, such as, for example, phosphonic acid groups.

For deposition from the gas phase, it is necessary that the compounds can be evaporated without decomposition for the formation of a monolayer, which often represents a problem, in particular in the case of free acids, such as sulfonic acids and phosphonic acids, since strongly acidic groups can cause autocatalytic decomposition on heating of a substance.

An object to be achieved consists in indicating an improved process for the production of a component.

A further object is to search for novel compounds which are suitable for the production of components using methods that are conventional in the memory industry, in particular spin coating or deposition from the gas phase.

It has now been found that these objects can be achieved, at least in part, if the components are produced by a process in accordance with independent Claim 1.

The invention relates to a process for the production of a component, comprising at least the following steps:
(1) provision of a substrate having a substrate surface,
(2) application of a solution comprising one or more compounds of the formula I to the substrate surface,
(3) heating of the substrate to a temperature in the range from 60° C. to 300° C.,
where formula I is defined as follows:

$$R^1\text{-}(A^1\text{-}Z^1)_r\text{—}(B^1)_n\text{—}(Z^2\text{-}A^2)_s\text{-Sp-G} \quad (I)$$

in which
$R^1$ denotes H, an alkyl or alkoxy radical having 1 to 15 C atoms, where, in addition, one or more $CH_2$ groups in these radicals may each be replaced, independently of one another, by —C≡C—, —CH═CH—,

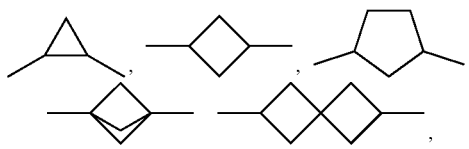

—O—, —S—, —$CF_2$O—, —O$CF_2$—, —CO—O—, —O—CO—, —Si$R^0R^{00}$—, —NH—, —N$R^0$— or —$SO_2$— in such a way that O atoms are not linked directly to one another, and in which, in addition, one or more H atoms may be replaced by halogen, CN, SCN or $SF_5$,
$R^0$, $R^{00}$ denote, identically or differently, an alkyl or alkoxy radical having 1 to 15 C atoms, in which, in addition, one or more H atoms may be replaced by halogen, $A^1$, $A^2$ on each occurrence, identically or differently, denote an aromatic, heteroaromatic, alicyclic or heteroaliphatic ring having 4 to 25 ring atoms, which may also contain condensed rings and which may be mono- or polysubstituted by Y,
Y on each occurrence, identically or differently, denotes F, Cl, CN, SCN, $SF_5$ or straight-chain or branched, in each case optionally fluorinated, alkyl, alkoxy, alkylcarbonyl, alkoxycarbonyl, alkylcarbonyloxy or alkoxycarbonyloxy having 1 to 12 C atoms,
$B^1$ denotes

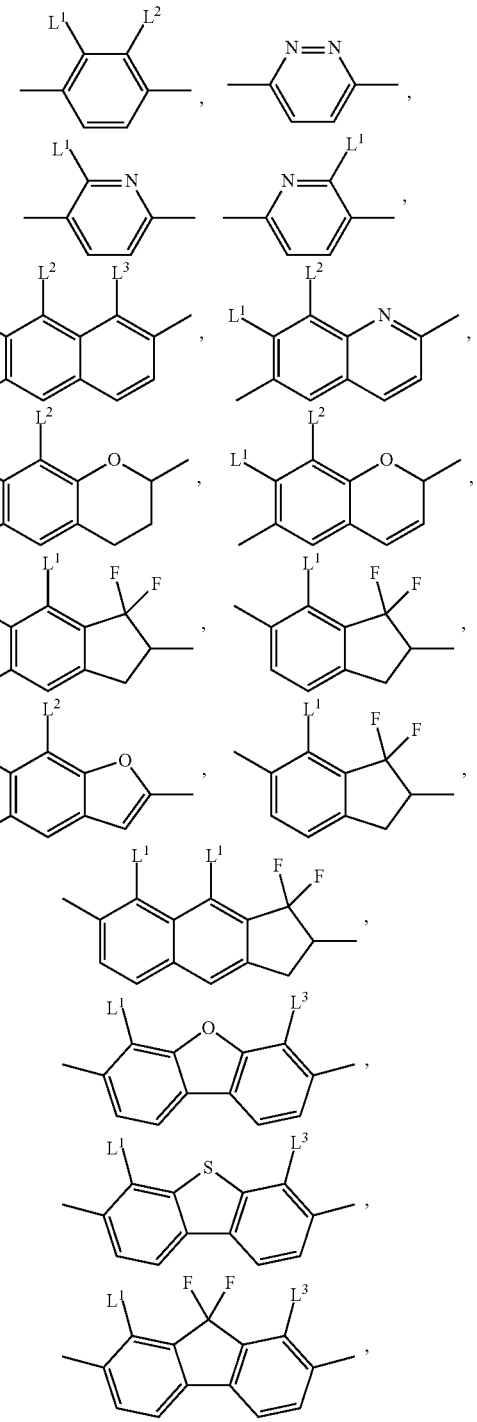

-continued

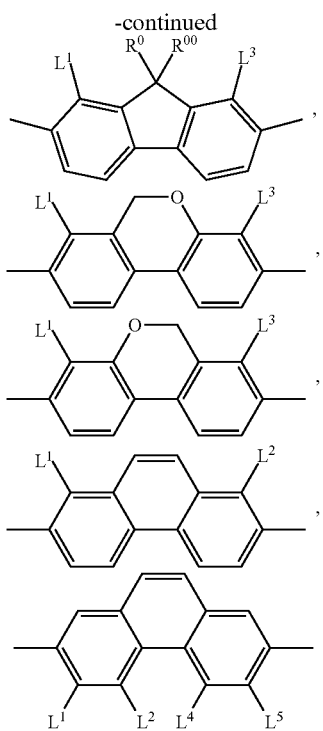

where the groups may be oriented in both directions,

L¹ to L⁵, independently of one another, denote F, Cl, Br, I, CN, SF₅, CF₃ or OCF₃, preferably Cl or F, where L³ may alternatively also denote H, Z¹, Z² on each occurrence, identically or differently, denote a single bond, —CF₂O—, —OCF₂—, —CF₂S—, —SCF₂—, —CH₂O—, —OCH₂—, —C(O)O—, —OC(O)—, —C(O)S—, —SC(O)—, —CH₂—, —(CH₂)₂—, —(CH₂)₃—, —(CH₂)₄—, —CF₂—, —CF₂—CF₂—, —CF₂—CH₂—, —CH₂—CF₂—, —CH═CH—, —CF═CF—, —CF═CH—, —CH═CF—, —(CH₂)₃O—, —O(CH₂)₃—, —C≡C—, —O—, —S—, —C═N—, —N═C—, —N═N—, —N═N(O)—, —N(O)═N— or —N═C—C═N—, Sp denotes a spacer group or a single bond, G denotes —SO₂OR^V, —OP(O)(OR^V)₂, —PO(OR^V)₂, —C(OH)(PO(OR^V)₂)₂, —COOR^V or —Si(OR^V)₃, R^V denotes secondary or tertiary alkyl having 3 to 20 C atoms, r and s, independently of one another, denote 0, 1, 2 or 3, where r+s 4, and n denotes 0 or 1.

The invention furthermore relates to a component for use in an electronic element containing a self-assembled monolayer, formed and set up for the adoption of two switching states, where the component has been produced by the above-mentioned process according to the invention, with the proviso that the self-assembled monolayer has been produced from one or more compounds of the above-mentioned formula I, for which n is equal to 1 and the other groups and parameters have the meanings indicated in Claim 1.

The invention furthermore relates to the use of the component according to the invention in a memristive electronic switching element.

The invention furthermore relates to compounds of the formula IA $$R^1-(A^1-Z^1)_r—B^1—(Z^2-A^2)_s-Sp-G \quad (IA)$$

in which the groups and parameters occurring have the meanings indicated above.

The compounds of the formulae I and IA are highly soluble in the above-mentioned solvents, which are used in industrially used processes, such as, for example, spin coating. The process according to the invention can thus be employed under conditions as have become established in the industrial production of memory chips. The components produced in this way have excellent applicational properties, in particular they are suitable for the production of switching elements for memristive devices, and are compatible with the standard methods and processes, switching parameters and design rules of silicon electronics (CMOS). The switching elements produced in this way have a high degree of reversibility of the switching operation without "fatigue phenomena".

Surprisingly, it has been found that the components produced by the present process have the same advantageous applicational properties as through use of the corresponding free protic (acidic) compounds (in which, for example, G denotes —P(O)(OH)₂).

The compounds of the formula IA are preferably mesogenic and have negative dielectric anisotropy.

Figure 1:
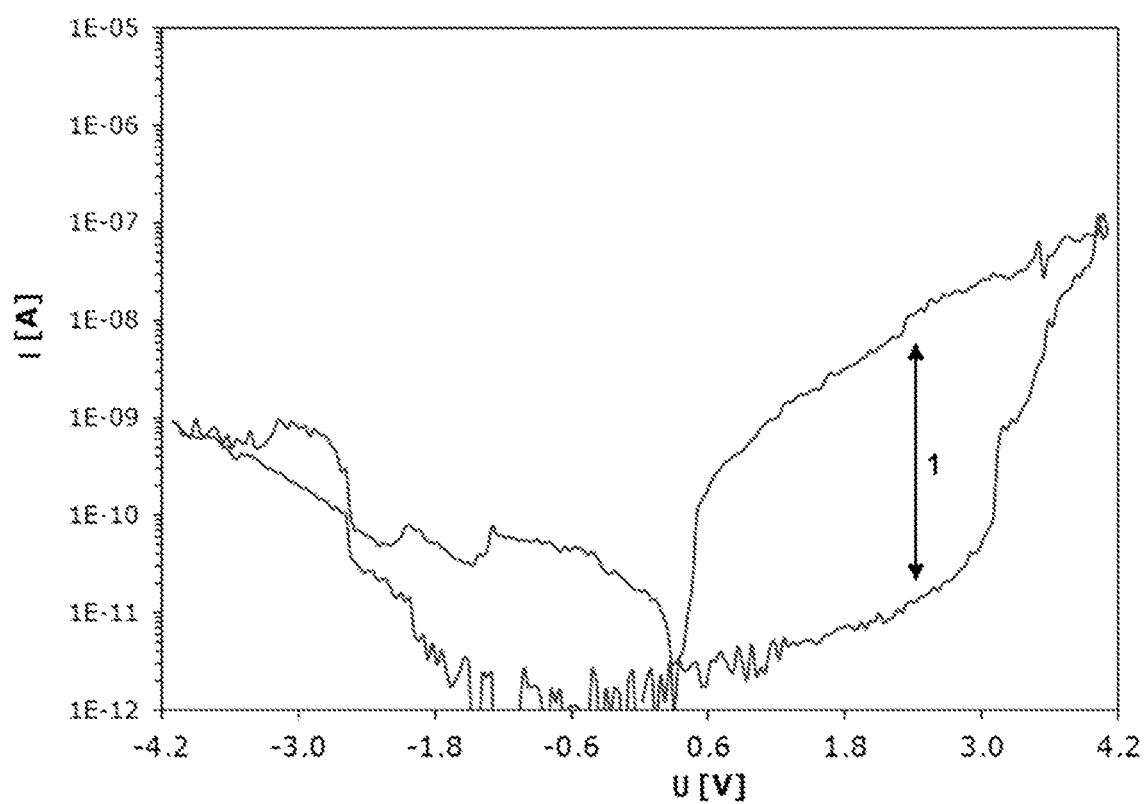
FIG. 1 shows the current/voltage curve of a component produced by the process according to the invention.

The term "mesogenic group" is known to the person skilled in the art and is defined in accordance with C. Tschierske, G. Pelzl, S. Diele, Angew. Chem. 2004, 116, 6340-6368, as the part of a molecule or macromolecule which, due to the anisotropy of its attracting and repelling interactions, makes a significant contribution to the low-molecular-weight or polymeric substances forming a liquid-crystalline mesophase. The majority of mesogenic groups consist of rigid rod- or disc-shaped units.

A mesogenic compound ("mesogen" for short) is characterised in that it contains one or more mesogenic groups. The mesogenic compounds here do not necessarily have to have a liquid-crystalline phase themselves.

The dielectric anisotropy Δε of a uniaxial mesogenic compound is defined as the difference between the dielectric constants parallel ($\varepsilon_\parallel$) and perpendicular ($\varepsilon_\perp$) to the longitudinal axis of the molecule. In the case of dielectrically negative compounds, it follows that $\Delta\varepsilon=(\varepsilon_\parallel-\varepsilon_\perp)<0$.

An anchor group in the sense of the present invention is a functional group by means of which the mesogenic compound is adsorbed onto or bonded to the surface of the substrate by physisorption, chemisorption or by chemical reaction.

A spacer group in the sense of the present invention is a flexible chain between mesogenic group and anchor group which causes a separation between these sub-structures and, owing to its flexibility, at the same time improves the mobility of the mesogenic group after bonding to a substrate.

The material in the sense of the present invention comprises one or more compounds of the formula I as defined above in a total concentration of 90 to 100%. The material preferably comprises one or more compounds of the formula IA in a total concentration of 50% to 100%. The material may comprise up to 5% of further surface-active compounds which are suitable for the formation of a self-assembled monolayer, preferably selected from the corresponding free phosphonic acids and sulfonic acids of the formula I.

If $R^1$ represents an alkyl radical, this is straight-chain or branched and has 1 to 15 C atoms. $R^1$ is preferably straight-chain and has, unless indicated otherwise, 1, 2, 3, 4, 5, 6 or 7 C atoms and is accordingly preferably methyl, ethyl, propyl, butyl, pentyl, hexyl or heptyl.

If $R^1$ represents an alkoxy radical, this is straight-chain or branched and contains 1 to 15 C atoms. $R^1$ is preferably straight-chain and has, unless indicated otherwise, 1, 2, 3, 4, 5, 6 or 7 C atoms and is accordingly preferably methoxy, ethoxy, propoxy, butoxy, pentoxy, hexoxy or heptoxy.

$R^1$ in formula I can furthermore be an alkenyl radical having 2 to 15 C atoms, which is straight-chain or branched and contains at least one C=C double bond. It is preferably straight-chain and has 2 to 7 C atoms. Accordingly, it is preferably vinyl, prop-1- or -2-enyl, but-1-, -2- or -3-enyl, pent-1-, -2-, -3- or -4-enyl, hex-1-, -2-, -3-, -4- or -5-enyl, hept-1-, -2-, -3-, -4-, -5- or -6-enyl. If the two C atoms of the C=C double bond are substituted, the alkenyl radical can be in the form of E and/or Z isomer (trans/cis). In general, the respective E isomers are preferred. Of the alkenyl radicals, prop-2-enyl, but-2- and -3-enyl, and pent-3- and -4-enyl are particularly preferred. Of the alkenyl radicals for use in accordance with a further aspect of the present invention with the aim of activation of the molecular layer, terminal alkenyls are preferred $R^1$ in formula I can also be an alkynyl radical having 2 to 15 C atoms, which is straight-chain or branched and contains at least one C—C triple bond. 1- and 2-propynyl and 1-, 2- and 3-butynyl are preferred.

Preferred aryl groups are derived, for example, from the parent structures benzene, naphthalene, tetrahydronaphthalene, 9,10-dihydrophenanthrene, fluorene, indene and indane.

Preferred heteroaryl groups are, for example, five-membered rings, such as, for example, furan, thiophene, selenophene, oxazole, isoxazole, 1,2-thiazole, 1,3-thiazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole and 1,3,4-thiadiazole, six-membered rings, such as, for example, pyridine, pyridazine, pyrimidine, pyrazine, 1,3,5-triazine, 1,2,4-triazine and 1,2,3-triazine, or condensed rings, such as, for example, indole, isoindole, indolizine, indazole, benzimidazole, benzotriazole, purine, naphthimidazole, benzoxazole, naphthoxazole, benzothiazole, benzofuran, isobenzofuran, dibenzofuran, thieno[2,3b]thiophene, thieno[3,2b]thiophene, dithienothiophene, isobenzothiophene, dibenzothiophene, benzothiadiazothiophene, 2H-chromen (2H-1-benzopyran), 4H-chromene (4H-1-benzopyran) and coumarin (2H-chromen-2-one), or combinations of these groups.

Preferred cycloaliphatic groups are cyclobutane, cyclopentane, cyclohexane, cyclohexene, cycloheptane, decahydronaphthalene, bicyclo[1.1.1]pentane, bicyclo[2.2.2]octane, spiro[3.3]heptane and octahydro-4,7-methanoindane.

Preferred heteroaliphatic groups are tetrahydrofuran, dioxolane, tetra-hydrothiofuran, pyran, dioxane, dithiane, silinane, piperidine and pyrrolidine.

$A^1$ and $A^2$, independently of one another and identically or differently on each occurrence, are particularly preferably selected from the following groups:
a) 1,4-phenylene, in which, in addition, one or two CH groups may be replaced by N and in which, in addition, one or more H atoms may be replaced by Y, b) the group consisting of trans-1,4-cyclohexylene and 1,4-cyclohexenylene, in which, in addition, one or more non-adjacent $CH_2$ groups may be replaced by —O— and/or —S— and in which, in addition, one or more H atoms may be replaced by Y, and c) the group consisting of 1,3-dioxolane-2,4-diyl, tetrahydrofuran-2,5-diyl, cyclobutane-1,3-diyl, 1,4-bicyclo[2.2.2]octanediyl, piperidine-1,5-diyl and thiophene-2,5-diyl, in which, in addition, one or more H atoms may be replaced by Y, where Y has the meaning indicated above under formula I and preferably denotes F, Cl, CN or $CF_3$.

In formula I, Sp preferably denotes a spacer group.

Preferred spacer groups Sp are selected from the formula Sp'-X', so that the radical G-Sp- corresponds to the formula G-Sp'-X'—, where Sp' denotes straight-chain or branched alkylene having 1 to 20, preferably 1 to 12 C atoms, which is optionally mono- or poly-substituted by F, Cl, Br, I or CN and in which, in addition, one or more non-adjacent $CH_2$ groups may each be replaced, independently of one another, by —O—, —S—, —NH—, —$NR^o$—, —$SiR^{oo}R^{ooo}$—, —CO—, —COO—, —OCO—, —OCO—O—, —S—CO—, —CO—S—, —$NR^{oo}$—CO—O—, —O—CO—$NR^{oo}$—, —$NR^{oo}$—CO—$NR^{oo}$—, —CH=CH— or —C≡C— in such a way that O and/or S atoms are not linked directly to one another, X' denotes —O—, —S—, —CO—, —COO—, —OCO—, —O—COO—, —CO—$NR^{oo}$—, —$NR^{oo}$—CO—, —$NR^{oo}$—CO—$NR^{oo}$—, —$OCH_2$—, —$CH_2O$—, —$SCH_2$—, —$CH_2S$—, —$CF_2O$—, —$OCF_2$—, —$CF_2S$—, —$SCF_2$—, —$CF_2CH_2$—, —$CH_2CF_2$—, —$CF_2CF_2$—, —CH=N—, —N=CH—, —N=N—, —CH=$CR^{oo}$—, —$CY^x$=$CY^{x'}$—, —C≡C—, —CH=CH—COO—, —OCO—CH=CH— or a single bond, $R^{oo}$ and $R^{ooo}$ each, independently of one another, denote H or alkyl having 1 to 12 C atoms, and $Y^x$ and $Y^{x'}$ each, independently of one another, denote H, F, Cl or CN.

X' is preferably —O—, —S—, —CO—, —COO—, —OCO—, —O—COO—, —CO—$NR^o$—, —$NR^o$—CO—, —$NR^o$—CO—$NR^o$— or a single bond.

Preferred spacer groups Sp' are —$(CH_2)_{p1}$—, —$(CF_2)_{p1}$—, —$(CH_2CH_2O)_{q1}$—$CH_2CH_2$—, —$(CF_2CF_2O)_{q1}$—$CF_2CF_2$—, —$CH_2CH_2$—S—$CH_2CH_2$—, —$CH_2CH_2$—NH—$CH_2CH_2$— or —$(SiR^{oo}R^{ooo}$—O$)_{p1}$—, in which p1 is an integer from 1 to 12, q1 is an integer from 1 to 3, and $R^{oo}$ and Rom have the meanings indicated above.

Particularly preferred groups —X'-Sp'- are —$(CH_2)_{p1}$—, —O—$(CH_2)_{p1}$—, —$(CF_2)_{p1}$—, —O$(CF_2)_{p1}$—, —OCO—$(CH_2)_{p1}$— and —OC(O)O—$(CH_2)_{p1}$—, in which p1 has the meaning indicated above.

Particularly preferred groups Sp' are, for example, in each case straight-chain ethylene, propylene, butylene, pentylene, hexylene, heptylene, octylene, nonylene, decylene, undecylene, dodecylene, octadecylene, perfluoroethylene, perfluoropropylene, perfluorobutylene, perfluoropentylene, perfluorohexylene, perfluoroheptylene, perfluorooctylene, perfluorononylene, perfluorodecylene, perfluoroundecylene, perfluorododecylene, perfluorooctadecylene, ethylenoxyethylene, methylenoxybutylene, ethylenethioethylene, ethylene-N-methyliminoethylene, 1-methylalkylene, ethenylene, propenylene and butenylene.

Particularly preferred sub-formulae of the formula IA are the sub-formulae IAa to IAf shown below:

| | |
|---|---|
| R¹-B¹-Sp-G | IAa |
| R¹-(A¹-Z¹)-B¹-Sp-G | IAb |
| R¹-(A¹-Z¹)₂-B¹-Sp-G | IAc |
| R¹-B¹-(Z²-A²)-Sp-G | IAd |
| R¹-B¹-(Z²-A²)₂-Sp-G | IAe |
| R¹-(A¹-Z¹)-B¹-(Z²-A²)-Sp-G | IAf | in which $R^1$, $A^1$, $A^2$, $B^1$, $Z^1$, $Z^2$, Sp and G have the meanings indicated above and preferably
$A^1$ and denote

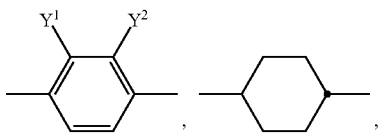

$B^1$ denotes

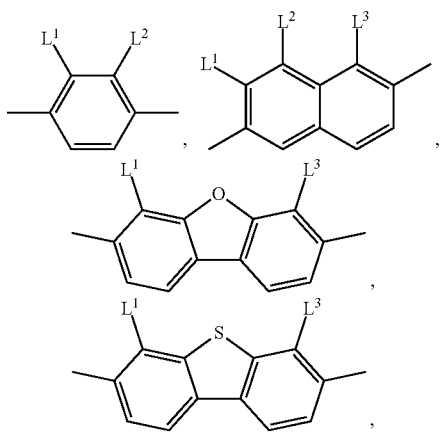

where the groups may be oriented in both directions,
$R^1$ denotes alkyl having 1-15 C atoms, preferably having 1-7 C atoms, in particular $CH_3$, $C_2H_5$, n-$C_3H_7$, n-$C_4H_9$, n-$C_5H_{11}$, n-$C_6H_{13}$ or n-$C_7H_{15}$.
$L^1$ and $L^2$, independently of one another, denote Cl or F,
$L^3$ denotes F,
$Y^1$ and $Y^2$, independently of one another, denote H, Cl or F,
$Z^1$, $Z^2$, independently of one another, denote a single bond, —$CF_2O$—, —$OCF_2$—, —$CH_2O$—, $OCH_2$— or —$CH_2CH_2$—,
Sp denotes unbranched 1,ω-alkylene having 1 to 12 C atoms,
G denotes —CH=$CH_2$, —OH, —SH, —$SO_2OH$, —OP(O)(OH)₂, —PO(OH)₂, —COH(PO(OH)₂)₂, —COOH, —Si(OR)₃ or —$SiCl_3$.
In a further preferred embodiment, in the compounds of the formulae IAa to IAf,
Sp denotes unbranched 1,ω-perfluoroalkylene having 1 to 12 C atoms,
where $R^1$, $A^1$, $B^1$, $Z^1$, $Z^2$ and G have the meanings indicated above.
Very particularly preferred sub-formulae of the formula IA are the subformulae IAa, IAb and IAd.

In a further embodiment, the material for the production of the monolayer according to the invention additionally comprises one or more compounds of the formula Ig $R^2$-G       Ig, in which $R^2$ has the meaning indicated for $R^1$ above under formula I and G has the meaning indicated above under formula I.

The one or more compounds of the formula Ig are preferably selected from the compounds of the formulae Ig-1 to Ig-3

  Ig-1

  Ig-2

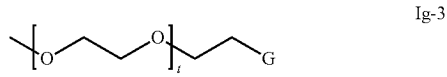  Ig-3 in which
G denotes —PO(OR$^V$)₂ or —$SO_2OR^V$,
$R^V$ denotes secondary or tertiary alkyl having 3 to 20 C atoms,
r denotes an integer from 1 to 20,
s denotes an integer from 1 to 18, and
t denotes an integer from 1 to 4.

Examples of preferred compounds of the formulae IAa to IAf are shown below:

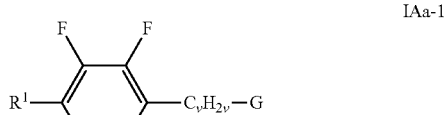  IAa-1

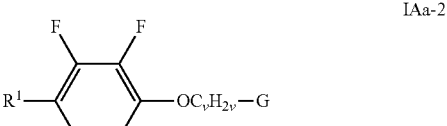  IAa-2

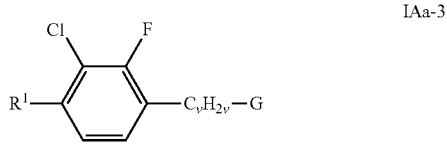  IAa-3

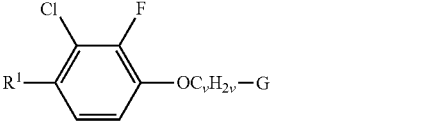  IAa-4

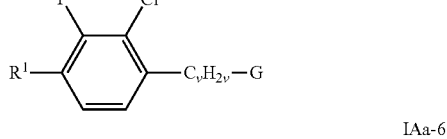  IAa-5

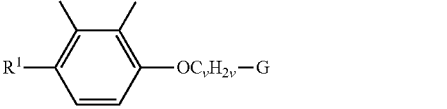  IAa-6

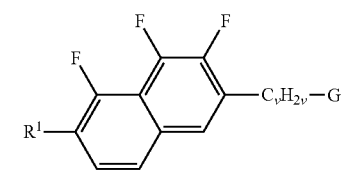 IAa-7
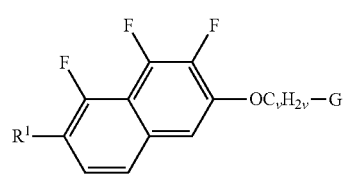 IAa-8
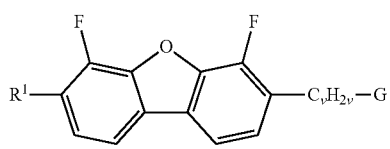 IAa-9
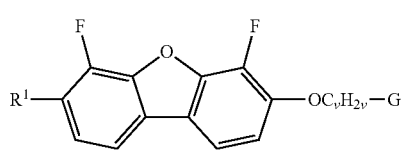 IAa-10
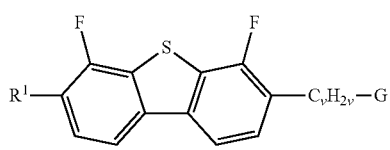 IAa-11
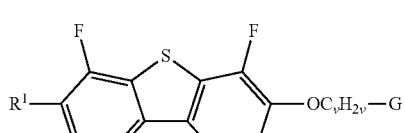 IAa-12
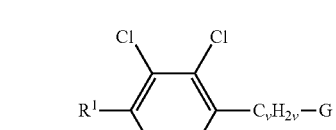 IAa-13
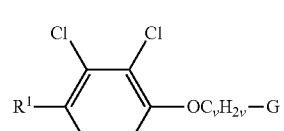 IAa-14
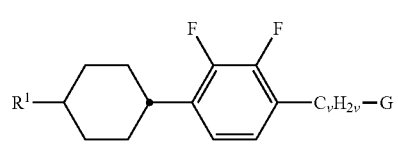 IAb-1
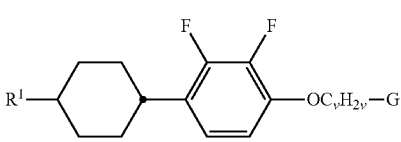 IAb-2
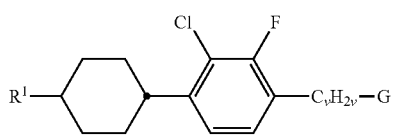 IAb-3
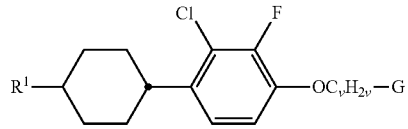 IAb-4
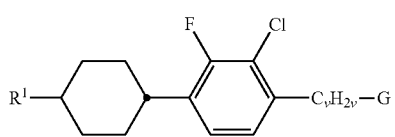 IAb-5
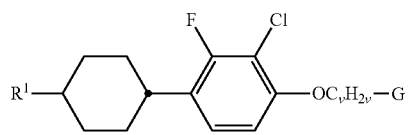 IAb-6
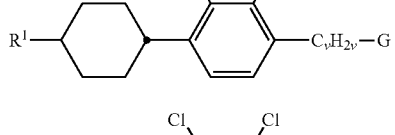 IAb-7
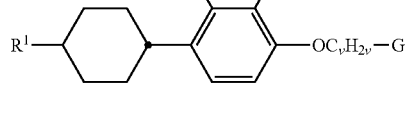 IAb-8
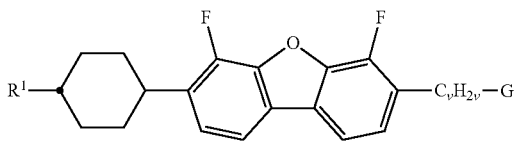 IAb-7
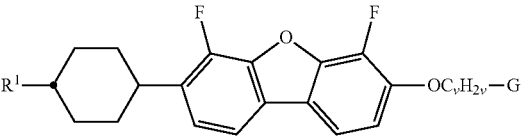 IAb-8
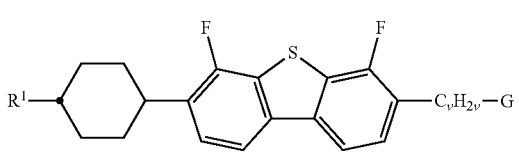 IAb-9
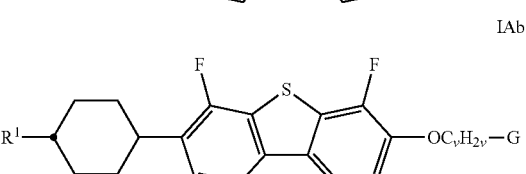 IAb-10

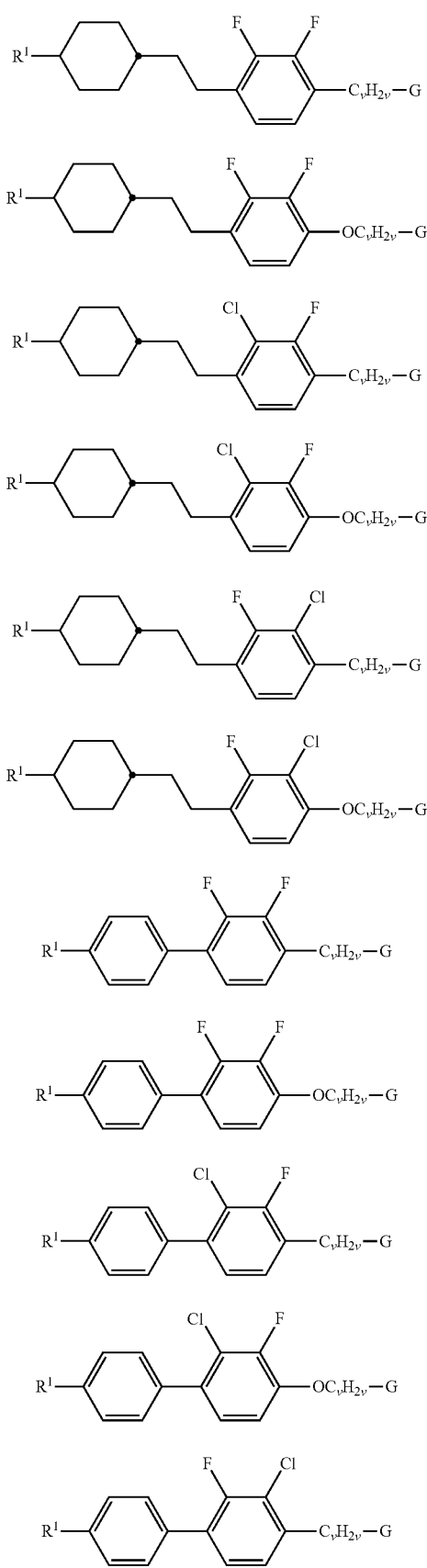
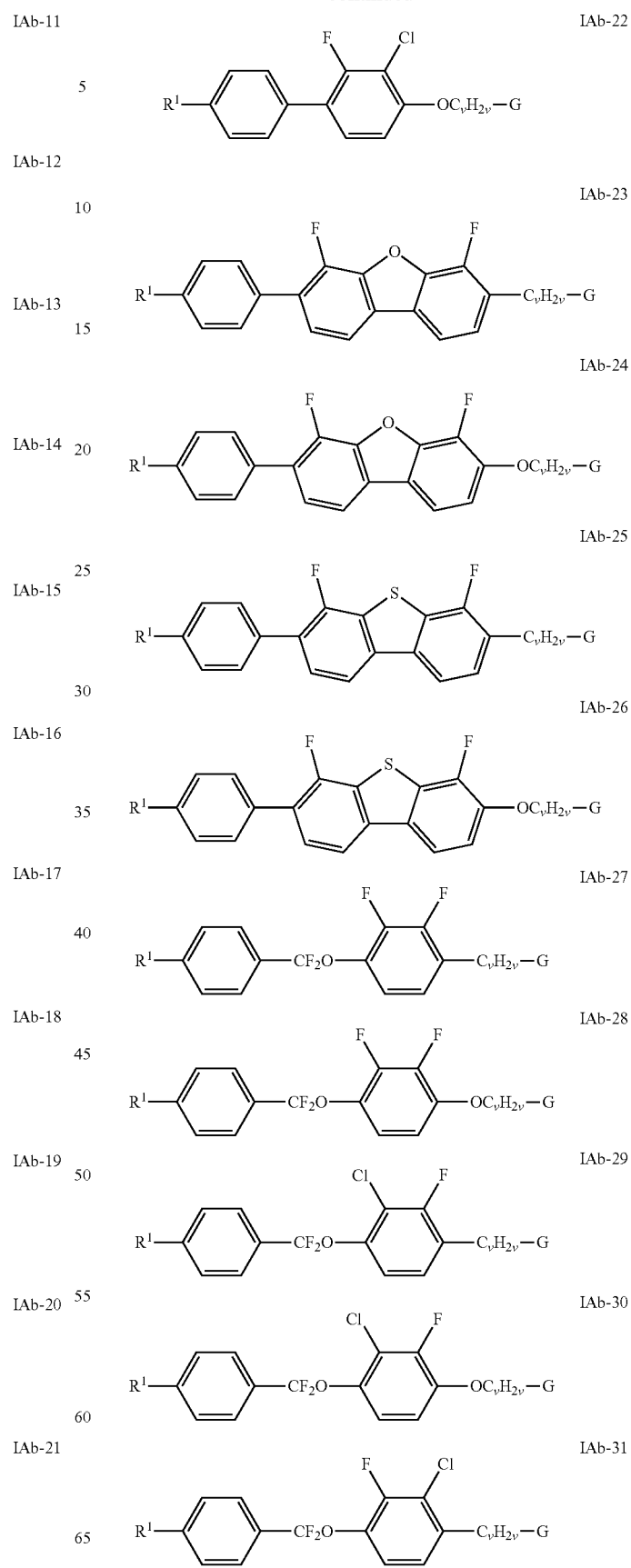

IAb-32
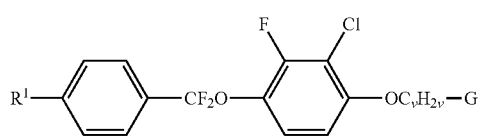
IAb-33
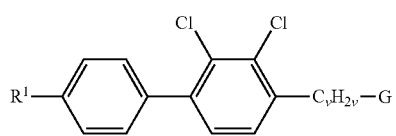
IAb-34
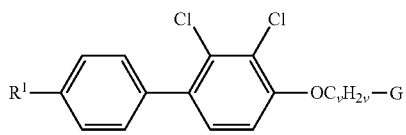
IAc-1
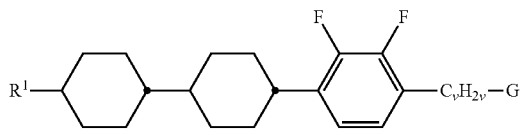
IAc-2
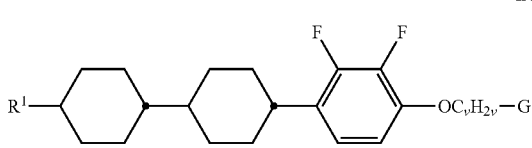
IAc-3
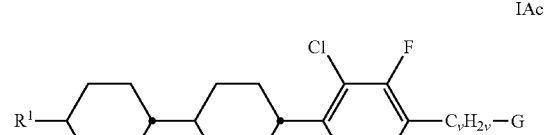
IAc-4
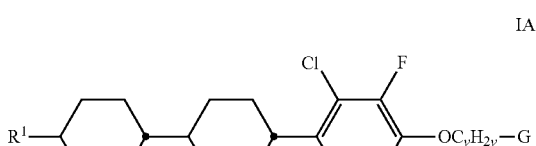
IAc-5
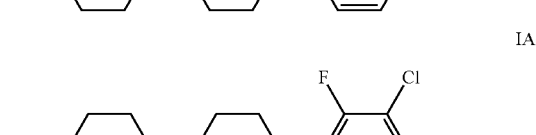
IAc-6
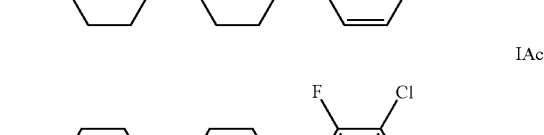
IAc-7
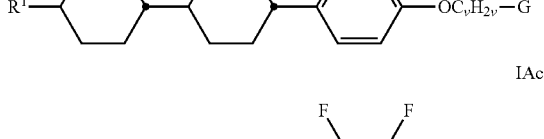
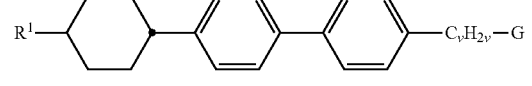
IAc-8
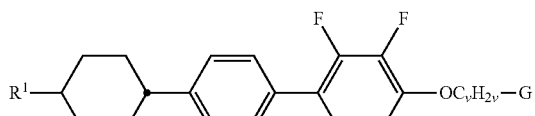
IAc-9
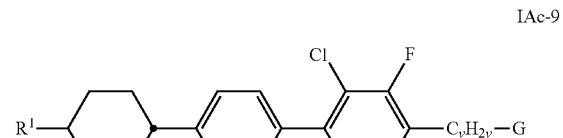
IAc-10
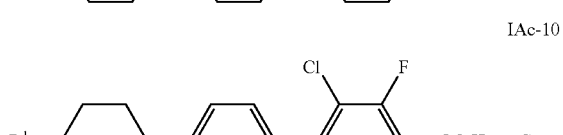
IAc-11
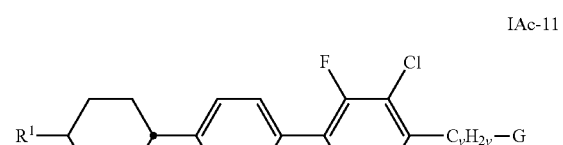
IAc-12
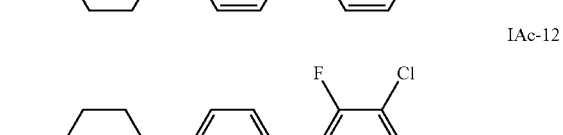
IAc-13
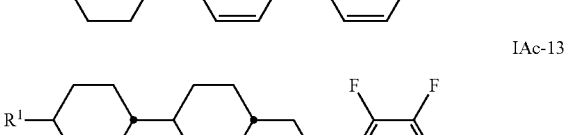
IAc-14
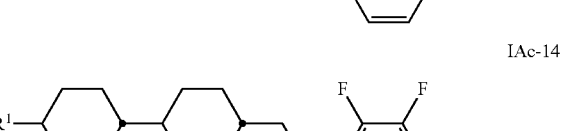
IAc-15
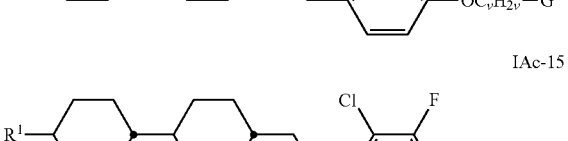
IAc-16
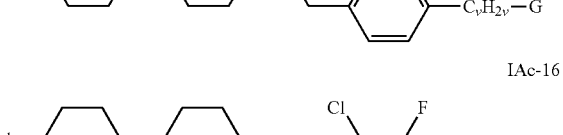
IAc-17
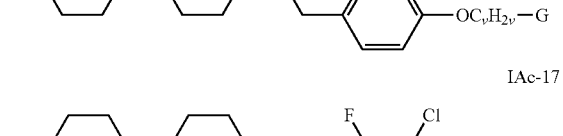

-continued
IAc-18
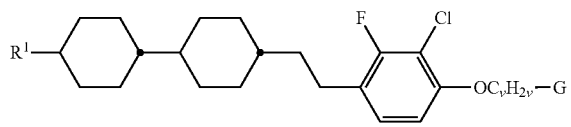
IAc-19
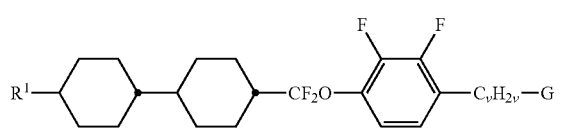
IAc-20
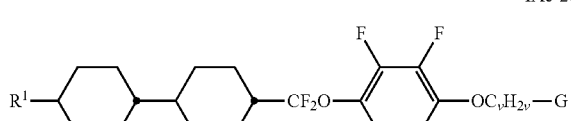
IAc-21
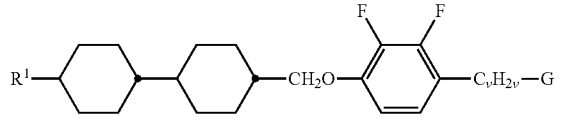
IAc-22
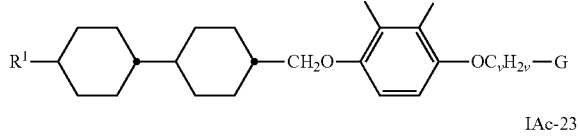
IAc-23
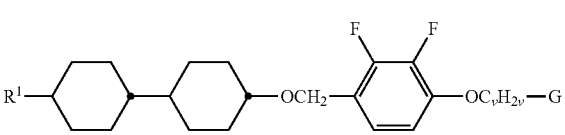
IAc-24
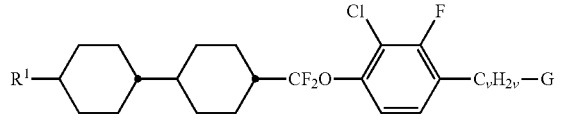
IAc-25
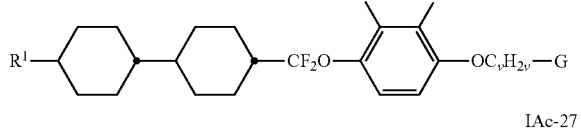
IAc-26
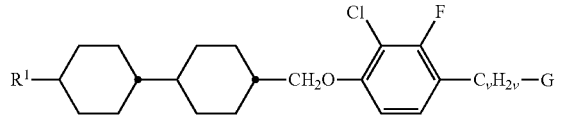
-continued
IAc-28
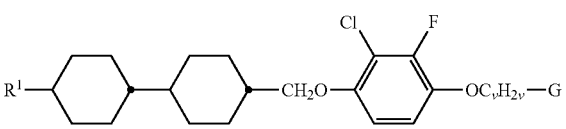
IAc-29
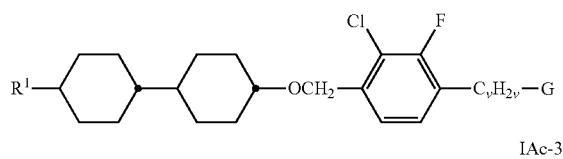
IAc-30
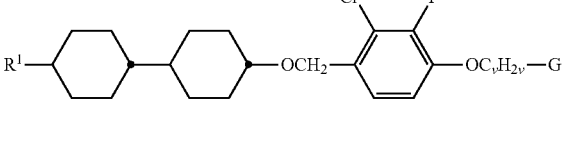
IAc-31
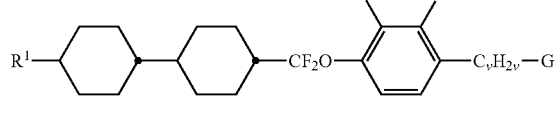
IAc-32
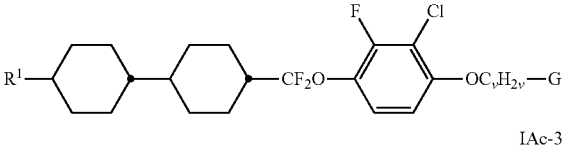
IAc-33
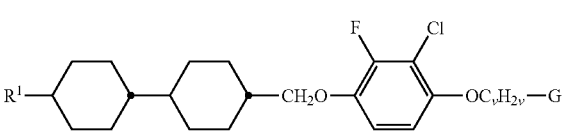
IAc-34
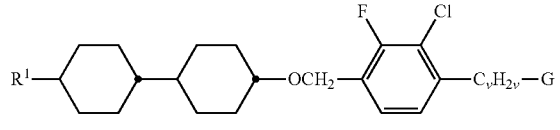
IAc-35
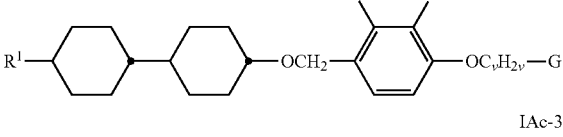
IAc-36
IAc-37
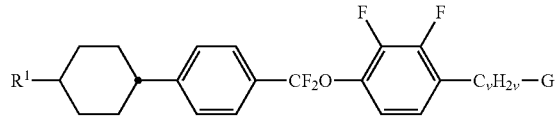

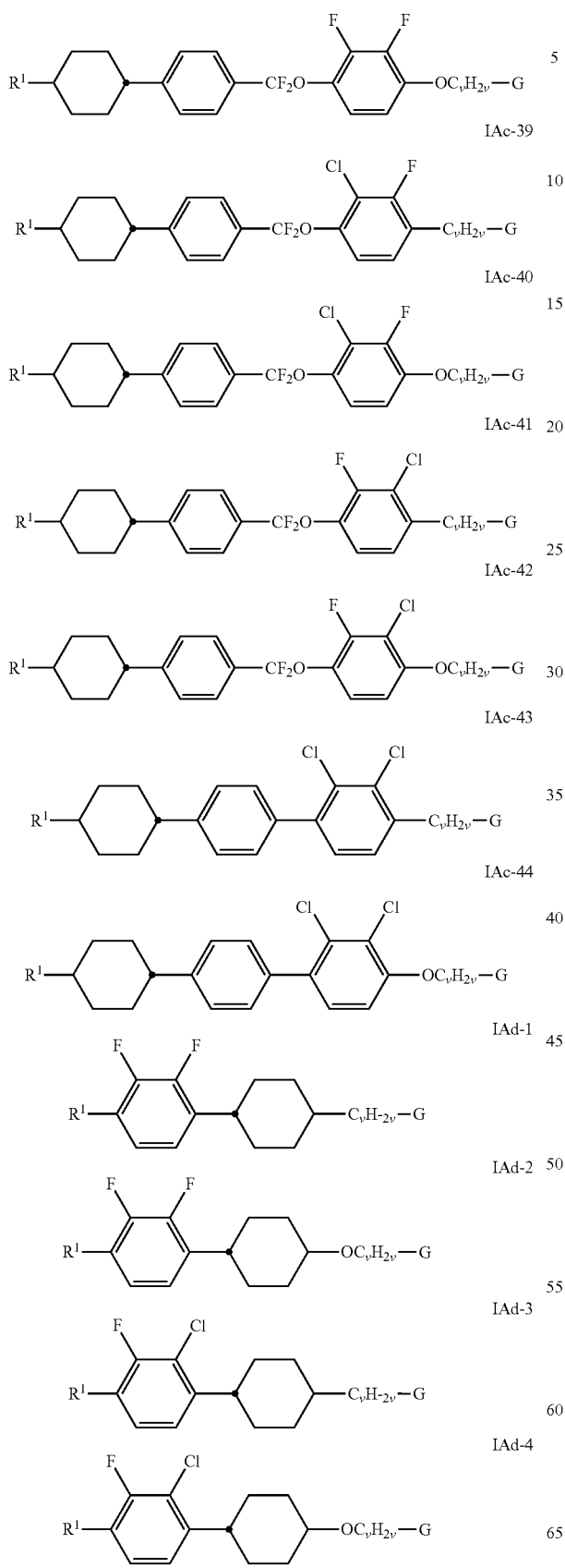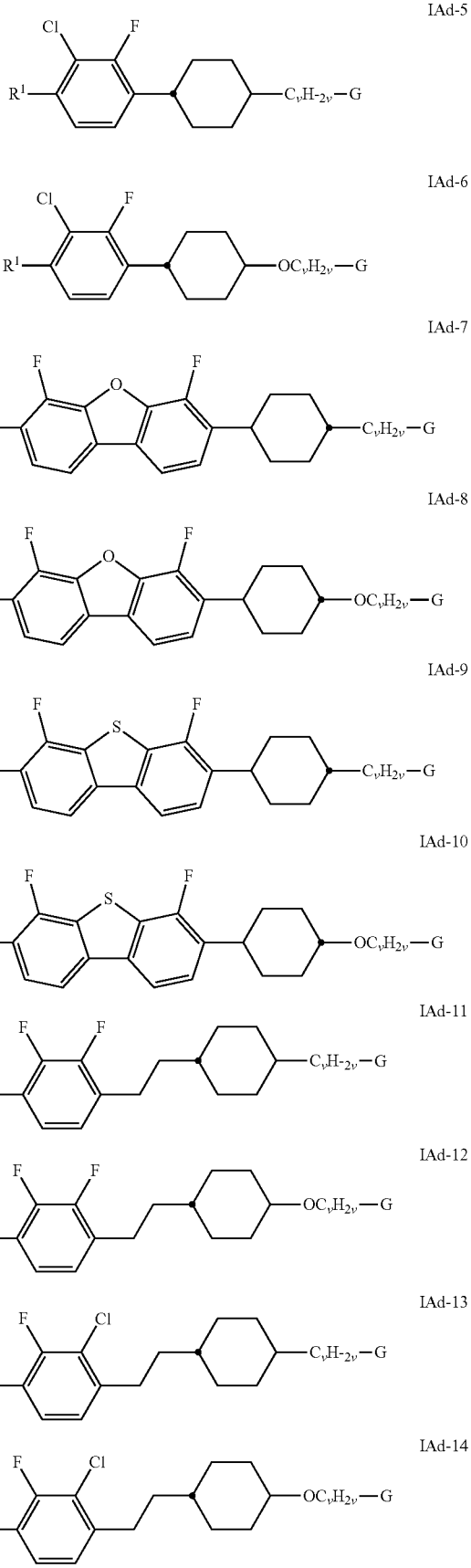

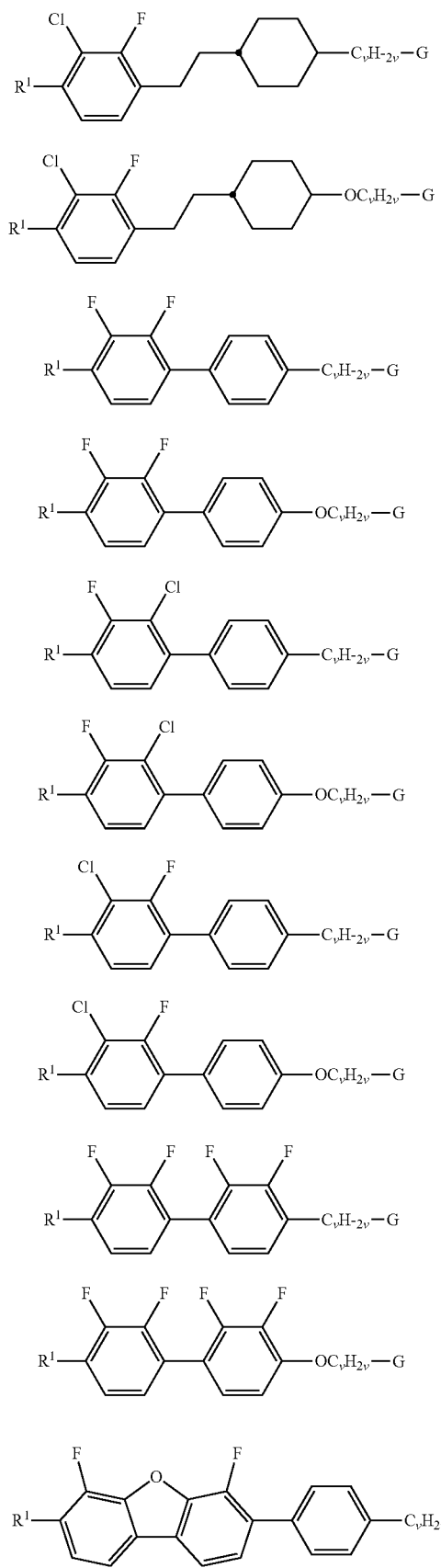
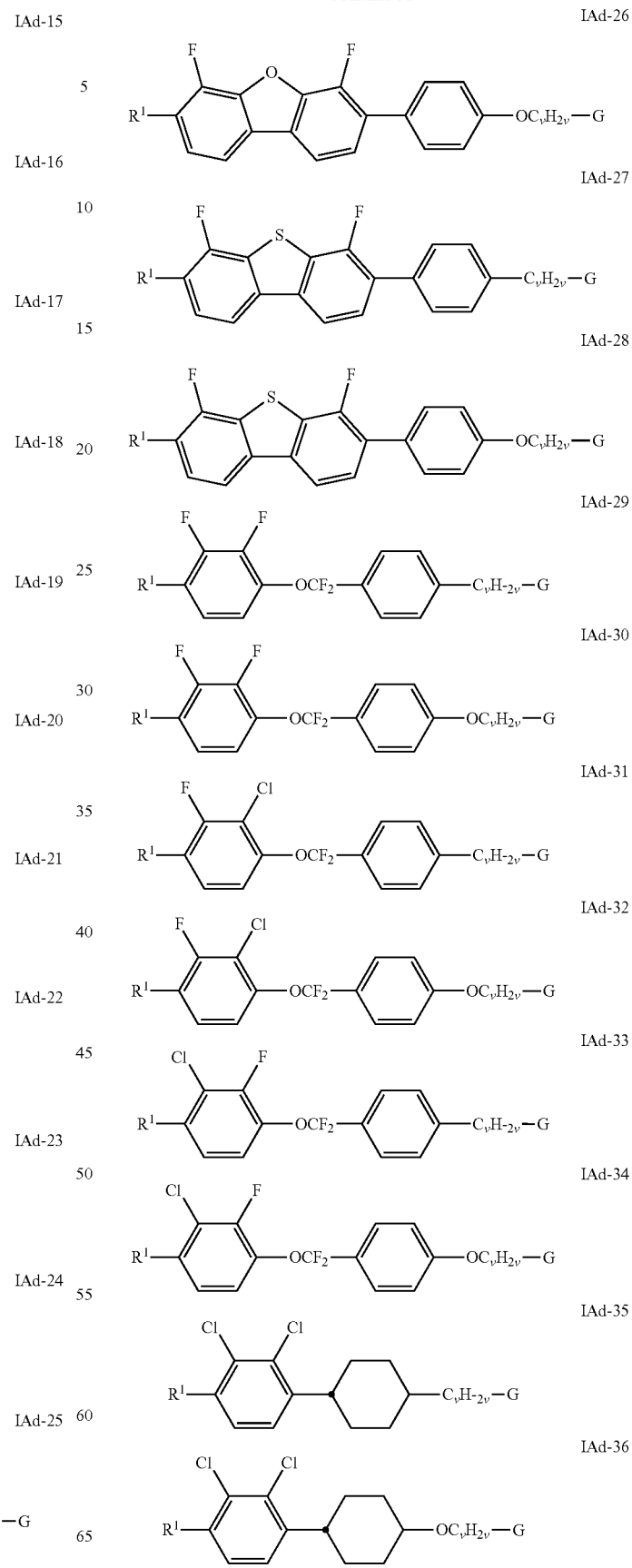

-continued

IAd-37, IAd-38, IAe-1 through IAe-18 (chemical structure diagrams)

IAe-19
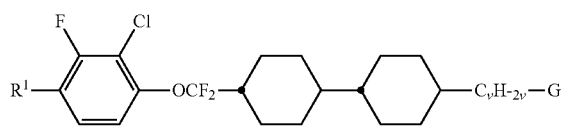
IAe-20
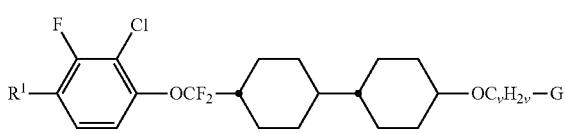
IAe-21
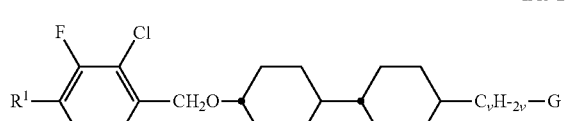
IAe-22
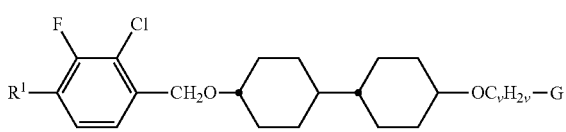
IAe-23
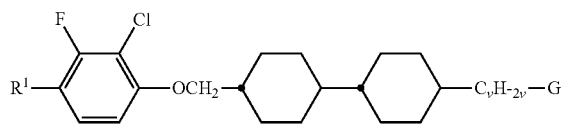
IAe-24
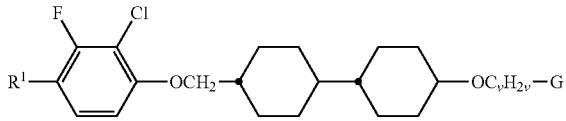
IAe-25
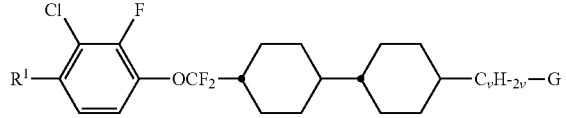
IAe-26
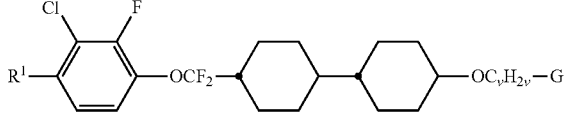
IAe-27
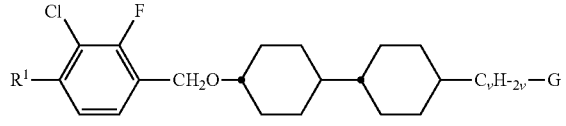
IAe-28
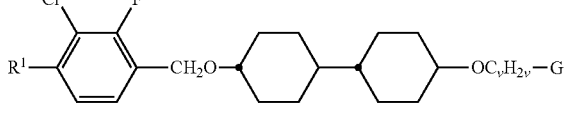
IAe-29
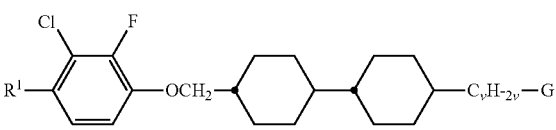
IAe-30
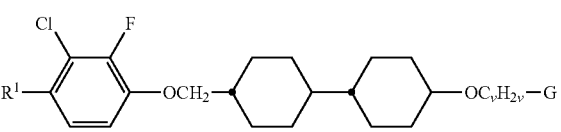
IAe-31
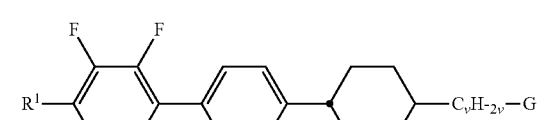
IAe-32
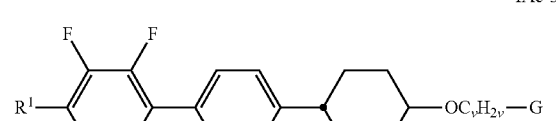
IAe-33
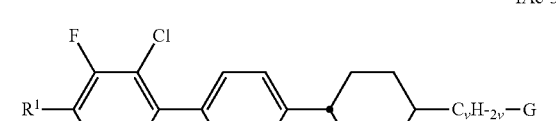
IAe-34
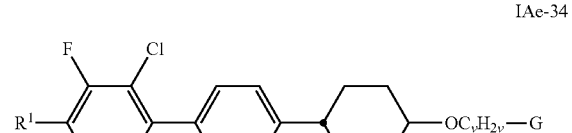
IAe-35
IAe-36
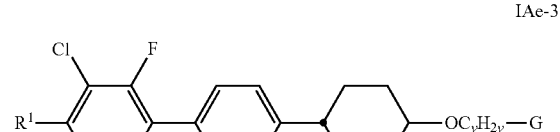
IAe-37
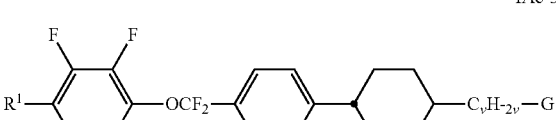
IAe-38
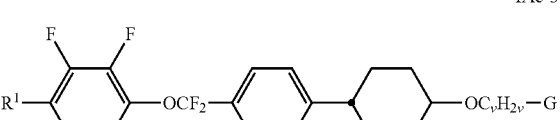

IAe-39
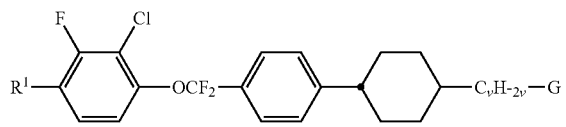
IAe-40
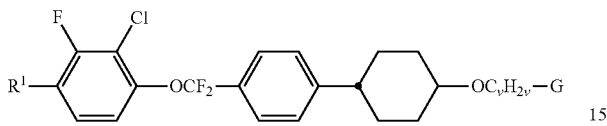
IAe-41
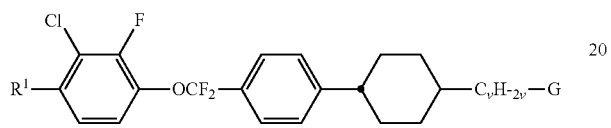
IAe-42
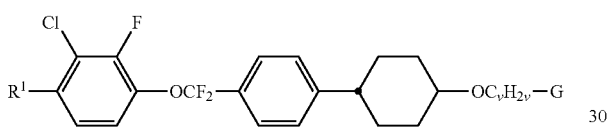
IAe-43
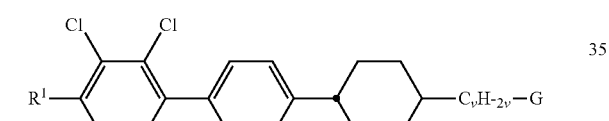
IAe-44
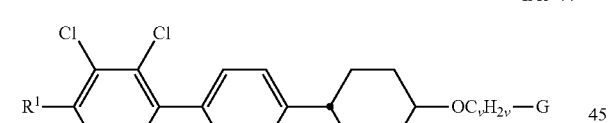
IAf-1
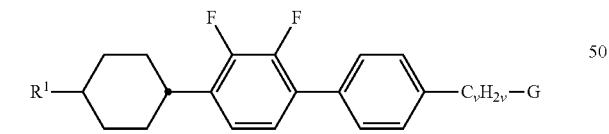
IAf-2
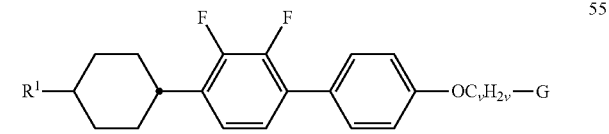
IAf-3
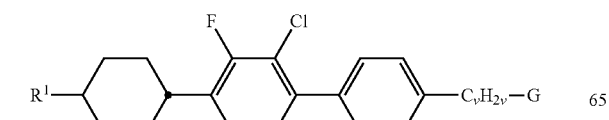
IAf-4
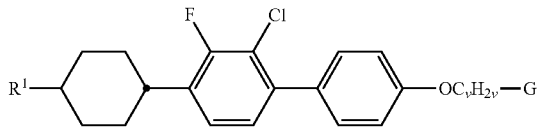
IAf-5
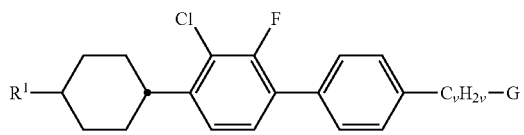
IAf-6
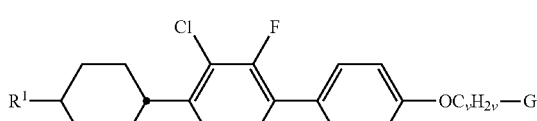
IAf-7
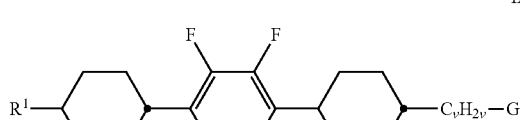
IAf-8
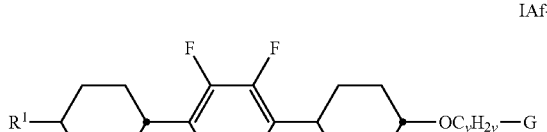
IAf-9
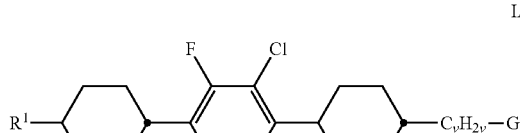
IAf-10
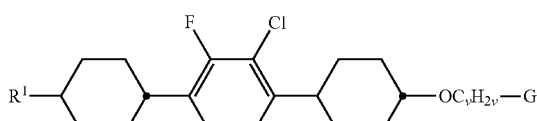
IAf-11
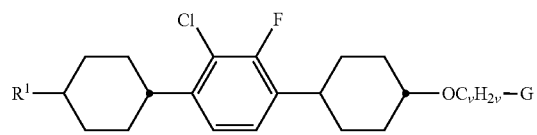
IAf-12
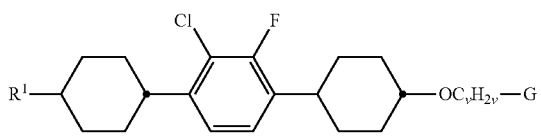

IAf-13
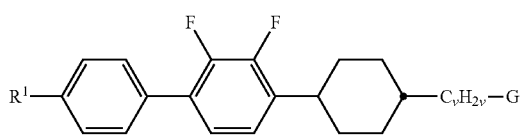

IAf-14
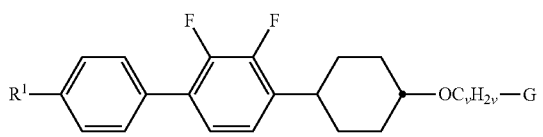

IAf-15
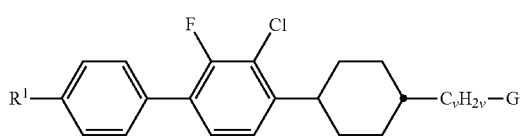

IAf-16
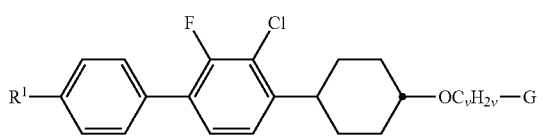

IAf-17
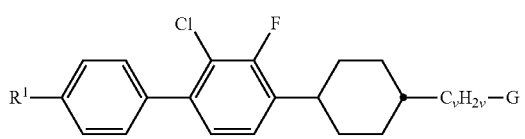

IAf-18
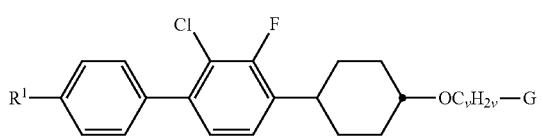

in which $R^1$ and G have the meanings given above and preferably $R^1$ denotes alkyl having 1 to 7 C atoms, G denotes —SO$_2$OR$^V$ or —PO(OR$^V$)$_2$, R$^V$ denotes an isopropyl or tert-butyl radical, and v denotes an integer from 1 to 12, preferably from 2 to 7.

Also covered by the description are compounds of the formula IA in which the group —C$_v$H$_{2v}$— has been replaced by —C$_v$F$_{2v}$— in the sub-formulae IAa-1 to IAa-14, IAb-1 to IAb-34, IAc-1 to IAc-44, IAd-1 to IAd-38, IAe-1 to IAe-44 and IAf-1 to IAf-18.

The process according to the invention is particularly suitable for the production of molecular layers in which the molecules contain reactive groups which, as described below, can be chemically activated for use in atomic layer deposition (ALD) and subsequent metallisation.

Self-assembled monolayers (SAMs) are frequently used in CMOS technology for the selective passivation of surfaces against the deposition of other materials by ALD, as described in M. Hashemi, F. Sadat, B. R. Birchansky, S. F. Bent, ACS Appl. Mater. Interfaces 2016, 8, 33264-33272. It is desirable to be able to reactivate an SAM-passivated surface of this type in a later process step in order to facilitate or simplify ALD deposition on the SAM. In particular for SAM-based electrically switchable tunnel junctions, a very useful process is one which facilitates the formation of a buffer layer under mild ALD conditions in order to protect the sensitive organic compounds of the SAM against high temperatures and reactive reagents during subsequent metal deposition on the SAM surface. The deposition of metal layers directly onto an SAM is only possible with very few metals, which, in addition, are often unsuitable for reliable and readily reproducible production of electronic components. An example is lead, which is deposited onto an SAM by vapour deposition. Typical problems are thermal damage to the sensitive SAM and migration of the top electrode metal through the SAM and reaction with the bottom electrode material. The use of a thin oxide or nitride layer deposited by ALD on the SAM protects the sensitive organic substances, acts as barrier layer and provides a nucleation layer for material deposition processes of all types.

A surface derivatised by an SAM allows ALD of, for example, aluminium oxide and other oxides only at very high concentrations or partial pressures of the starting substances (cf. S. Seo, B. C. Yeo, S. S. Han, C. M. Yoon, J. Y. Yang, J. Yoon, C. Yoo, H.-J. Kim, Y.-B. Lee, S. J. Lee et al., ACS Appl. Mater. Interfaces, 2017). Such high partial pressures may be hazardous (for example with highly flammable trimethylaluminium as process gas) and reduce the advantage of the chemoselectivity of the monolayer compared with other surfaces in respect of area-selective deposition. The molecular layer is therefore used firstly as ALD inhibitor, as described here, with subsequent activation facilitating ALD under normal process conditions. A preferred reactive group for the derivatisation of a SAM is the alkenyl group. Alkenyl-terminated SAMs and SAM precursors are known in principle, as described, for example, in M. C. Campos, J. M. J. Paulusse, H. Zuilhof, Chem. Comm. 2010, 46, 5512-5514, or are even commercially available, such as, for example, allyltrichlorosilane (CAS No. 107-37-9) and 10-undecenylphosphonic acid (CAS No. 867258-92-2).

The activation of the SAM containing alkenyl groups is carried out, for example, using ozone by the method of T. M. McIntire, O. Ryder, B. J. Finlayson-Pitts, J. Phys. Chem. C 2009, 113, 11060-11065, for the generation of a secondary ozonide, which is derivatised by subsequent treatment with trimethylaluminium in the gas phase by the method of J. Huang, M. Lee, A. Lucero and J. Kim, Chem. Vap. Deposition 2013, 19, 142-148.

The ozonide can also be reduced via an intermediate step, for example to aldehydes, using suitable volatile reducing agents (alkyl sulfides or alkyl-phosphines) whose oxides are likewise volatile (example dialkyl sulfone, trialkylphosphine oxide) (see Schema 1). The reactions are depicted in Scheme 1 below.

Scheme 1
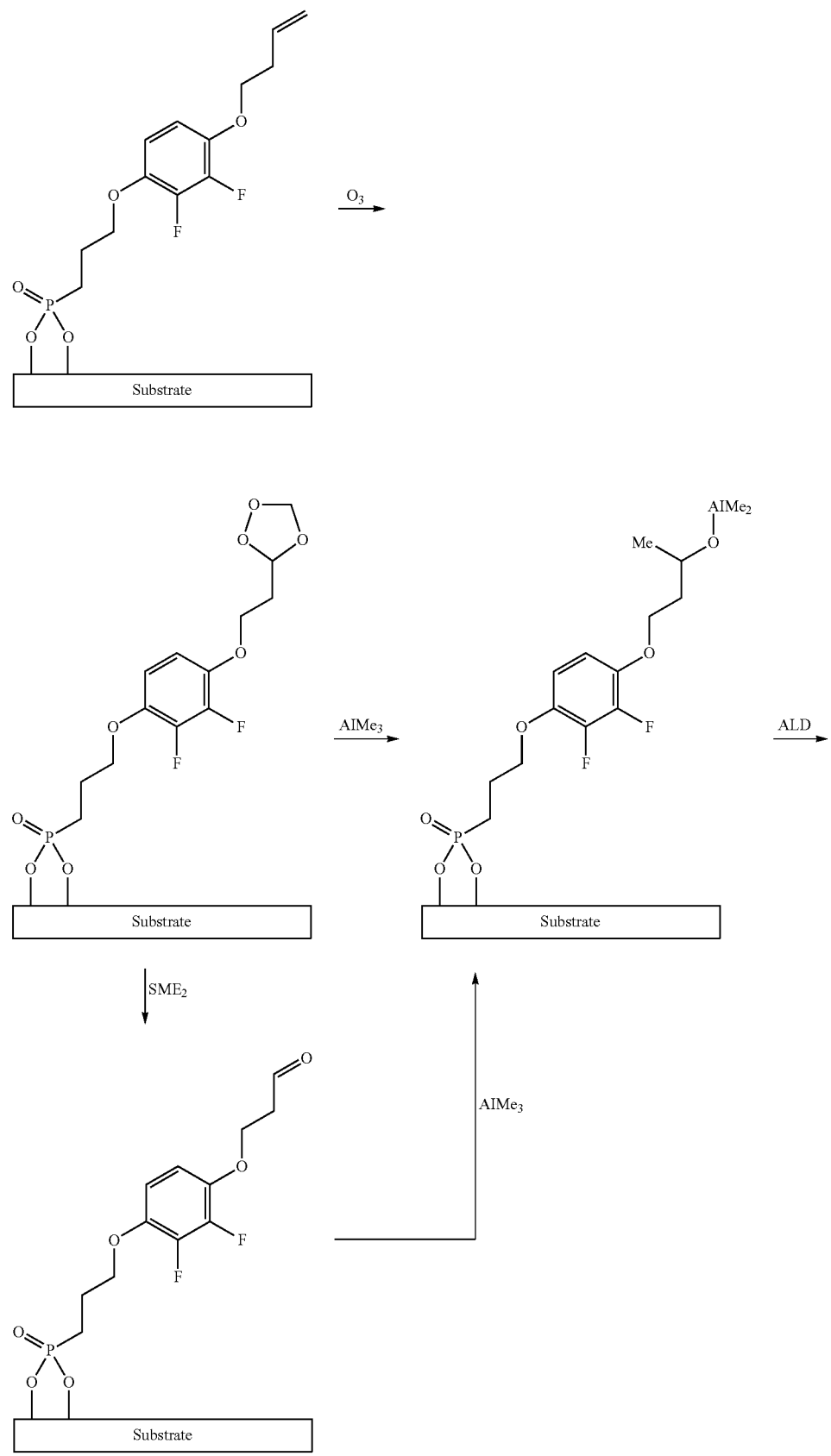

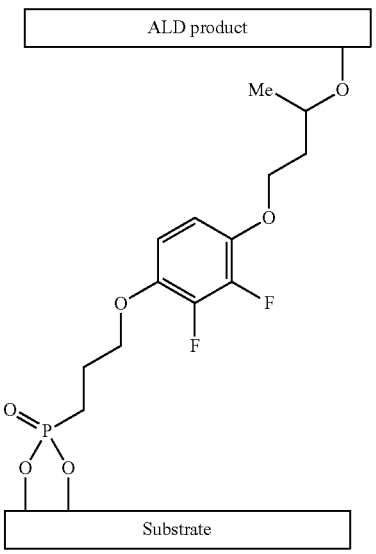 [SMILES: COC(C)CCOc1ccc(OCCCP(=O)(OC)OC)c(F)c1F]

Oxides, such as Al$_2$O$_3$, TiO$_2$, ZrO$_2$, HfO$_2$, ITO, AZO, IGZO or IGO, nitrides (TiN$_x$, TaN$_x$ or Si$_3$N$_4$), or metals, such as W, Mo, Co, Cr, Al, Cu, Ag or Ru, can be deposited on the oxidatively activated SAM by ALD (Scheme 1: "ALD product").

A further layer can subsequently be applied to the layer deposited onto the SAM by ALD is subsequently possible. In this case, a metal or another conducting or semiconducting material is applied. Preferred methods for the application of this further layer are physical gas-phase deposition (vapour deposition, sputtering, etc.), chemical gas-phase deposition, and ALD.

According to a further aspect of the present invention, a process is thus provided which comprises the following steps:
(1) provision of a substrate having a substrate surface,
(2) application of a solution comprising one or more compounds of the formula IB onto the substrate surface,
(3) heating of the substrate to a temperature in the range from 60° C. to 300° C.,
(4) treatment of the surface with ozone,
where formula IB is defined as follows:

$$R^3 \diagdown \diagup Sp'—(A^1—Z^1)_r—(B^1)_n—(Z^2—A^2)_s—Sp—G \atop R^4 \diagup \quad (IB)$$

in which
R$^3$ and R$^4$, independently of one another, denote H, F, Cl, alkyl or alkoxy having 1 to 6 C atoms, preferably H or CH$_3$, particularly preferably H,
Sp' denotes straight-chain or branched or cyclic alkylene having 1 to 20 C atoms, in which one or more H atoms may be replaced by F or CH$_3$ and in which one or more non-adjacent CH$_2$ groups may be replaced by 0, preferably straight-chain alkylene, preferably straight-chain alkylene having 1 to 15 C atoms, in particular having 2 to 10 C atoms, and in which the other groups and parameters have the meanings indicated for formula I in claim 1, with the proviso that the anchor group G is not vinyl.

Preferred compounds of the formula IB are those like the sub-formula defined above for formula IA in which the group R$^1$ in each case denotes $$R^3 \diagdown \diagup Sp'— \atop R^4 \diagup$$

in which R$^3$, R$^4$ and Sp' have the meanings indicated for formula IB.

Suitable substrates are known to the person skilled in the art. Particularly suitable substrates are selected from:
element semiconductors, such as Si, Ge, C (diamond, graphite, graphene, fullerene), α-Sn, B, Se and Te;
compound semiconductors, preferably
group III-V semiconductors, in particular GaAs, GaP, InP, InSb, InAs, GaSb, GaN, TaN, TiN, MoN, WN, AlN, InN, Al$_x$Ga$_{1-x}$As and In$_x$Ga$_{1-x}$Ni,
group II-VI semiconductors, in particular ZnO, ZnS, ZnSe, ZnTe, CdS, CdSe, CdTe, Hg$_{(1-x)}$Cd$_{(x)}$Te, BeSe, BeTex and HgS;
group III-VI semiconductors, in particular GaS, GaSe, GaTe, InS, InSex and InTe,
group I-III-VI semiconductors, in particular CuInSe$_2$, CuInGaSe$_2$, CuInS$_2$ and CuInGaS$_2$,
group IV-IV semiconductors, in particular SiC and SiGe,
group IV-VI semiconductors, in particular SeTe;
organic semiconductors, in particular polythiophene, tetracene, pentacene, phthalocyanines, PTCDA, MePTCDI, quinacridone, acridone, indanthrone, flaranthrone, perinone, AlQ$_3$, and mixed systems, in particular PEDOT:PSS and polyvinylcarbazole/TLNQ complexes;
metals, in particular Ta, Ti, Co, Mo, Pt, Ru, Au, Ag, Cu, Al, W and Mg;
conductive oxidic materials, in particular indium tin oxide (ITO), indium gallium oxide (IGO), InGa-α-ZnO (IGZO), aluminium-doped zinc oxide (AZO), tin-doped zinc oxide (TZO), fluorine-doped tin oxide (FTO) and antimony tin oxide;
metal oxides ($SiO_2$, $Al_2O_3$, $TiO_2$, $HfO_2$ and $ZrO_2$);
metal nitrides ($Si_3N_4$, $TaN_x$ and $TiN_x$); mixed metal oxynitrides ($TiN_xO_y$ and $TaN_xO_y$).

In an alternative embodiment, the substrate surface has a coating consisting of a different material from the substrate. The thickness of the layer is preferably 0.5-5 nm. Methods for the production of such layers are known to the person skilled in the art, preference being given to methods such as atomic layer deposition, chemical gas-phase deposition or treatment with oxidative or reductive plasma, preferably with oxygen plasma. The coating is suitable for the formation of a particularly stable self-assembled monolayer, and preferably consists of an oxide and/or nitride of one or more metals or semi-metals, particularly preferably of $SiO_2$, $Al_2O_3$, $HfO_2$, $TiO_2$, $TiN_x$ or $TiN_xO_y$.

In the process according to the invention, the application of the solution of the material to the substrate can be carried out by conventional methods for the coating of surfaces, such as dip coating, knife coating, spray coating, roller coating, spin coating, furthermore spray coating, slot-die coating, and conventional printing processes, such as, for example, ink-jet printing, screen printing, microcontact stamp printing, and in addition by deposition from the gas phase. Spin coating and deposition from the gas phase are preferred.

After the application of the solution, the solvent is firstly removed, for example by warming to a temperature above 20° C. and/or under reduced pressure below 1000 hPa, preferably below 750 hPa, and/or under a stream of inert gas. The substrate is subsequently heated to a temperature in the range from 60° C. to 300° C., preferably from 100° C. to 250° C., particularly preferably from 140° C. to 180° C. Without being tied to a theory, it is thought that the secondary or tertiary esters of the formula I eliminate an alkene on heating and are then in the form of the free acids, which then bind to the substrate by chemisorption, in particular by an addition reaction or condensation reaction.

The component is then cleaned from reaction products and excess material by washing with a suitable solvent, for example isopropanol or tetrahydrofuran, optionally under the action of ultrasound, and dried again as described above.

In a preferred embodiment, the substrate is annealed after the deposition of the monolayer. The annealing is carried out at a temperature above 20° C. and below 300° C., preferably above 50° C. and below 200° C., particularly preferably above 90° C. and below 150° C. The duration of the annealing is 10 min to 48 h, preferably 1 to 24 h, particularly preferably 4 to 16 h.

In an alternative embodiment, the deposition of the material is carried out from the gas phase at a pressure of less than 500 hPa, preferably less than 200 hPa, particularly preferably less than 50 hPa. The material is evaporated here at a temperature at which decomposition does not occur. The determination this temperature is known to the person skilled in the art, a suitable method being, for example, dynamic differential calorimetry.

The compounds of the general formula I can be prepared by methods known per se, as described in the literature (for example in the standard works, such as Houben-Weyl, Methoden der organischen Chemie [Methods of Organic Chemistry], Georg-Thieme-Verlag, Stuttgart), to be precise under reaction conditions which are known and suitable for the said reactions. Use can be made here of variants known per se which are not mentioned here in greater detail.

If desired, the starting materials can also be formed in situ by not isolating them from the reaction mixture, but instead immediately converting them further into the compounds of the general formula I.

The syntheses of compounds of the general formula I according to the invention are described in illustrative terms in the examples. The starting substances can be obtained by generally accessible literature procedures or are commercially available.

Particularly suitable synthetic routes to the compounds according to the invention are illustrated below with reference to Schemes 1 and 2 and are explained in greater detail with reference to the working examples, without restricting them thereby.

Phosphonic acid esters of the formula I can be prepared from the corresponding phosphonic acids by standard processes (Schemes 1 and 2). This is carried out, for example, by the method of A. K. Purohit, D. Pardasani, V. Tak, A. Kumar, R. Jain, D. K. Dubey, *Tetrahedron Lett.* 2012, 53, 3795-3797, from the acid and the alcohol in the presence of a suitable condensation reagent, such as polymer-bound triphenylphosphine/iodine, or by the method of T. Hara, S. R. Durell, M. C. Myers, D. H. Appella, *J. Am. Chem. Soc.* 2006, 128, 1995-2004, from the acid by reaction with an activated alcohol, such as tert-butyl trichloroacetimidate Scheme 1

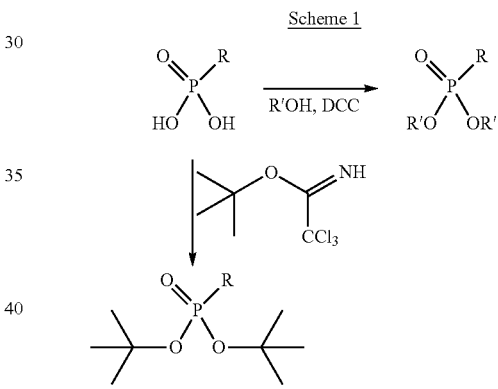

Sulfonic acid esters of the formula I are prepared via the acid chloride by reaction with an alcohol in the presence of a base, for example triethylamine, as described, for example, in Z. Guan, X. Chai, S. Yu, Q. Meng, Q. Wu, *Chem. Biol. Drug Des.* 2010, 76, 496-504. Another process, in particular for the preparation of secondary alkyl sulphonates, is, according to I. Galyker, W. C. Still, *Tetrahedron Lett.* 1982, 23, 4461-4464, the Mitsunobu condensation.

Scheme 2

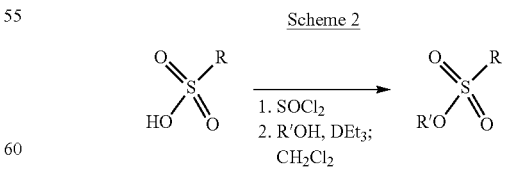

The invention is not restricted to the illustrative embodiments described here and the aspects emphasised therein. Instead, a multiplicity of modifications which are within the scope of action of the person skilled in the art are possible within the range indicated by the claims.

EXAMPLES

1. Synthesis Examples

Example 1: Di-tert-butyl (3-(2,3-difluoro-4-(4-pentylcyclohexyl)phenoxy)-propyl)phosphonate Step 1: 1-(3-Bromopropoxy)-2,3-difluoro-4-(4-pentylcyclohexyl)benzene

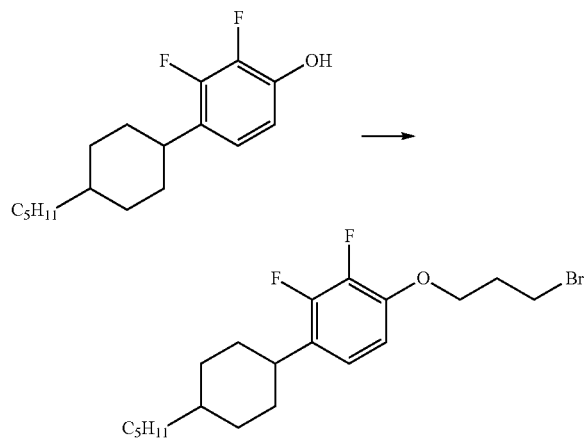

2,3-Difluoro-4-(4-pentylcyclohexyl)phenol (7.6 g, 27 mmol) is dissolved in acetone (80 ml), anhydrous potassium carbonate (20.0 g, 150 mmol) and 1,3-dibromopropane (20.4 g, 10.4 ml, 105 mmol) are added, and the mixture is heated under reflux for 12 h. The batch is filtered and evaporated, and the residue is chromatographed on silica gel with dichloromethane:n-pentane (1:10), giving 1-(3-bromopropoxy)-2,3-difluoro-4-(4-pentylcyclohexyl)benzene as a colourless solid of m.p. 40-43° C.

$^1$H NMR (400 MHz, CDCl$_3$): δ 6.83 (dd, $^3J_{HH}$=9.2 Hz, $^4J_{HF}$=2.3 Hz, 1H, H$_{Ar}$), 6.68 (dd, $^3J_{HH}$=7.33 Hz, $^4J_{HF}$=1.9 Hz, 1H, H$_{Ar}$), 4.13 (t, $^3J_{HH}$=5.7 Hz, 2H, CH$_2$) 3.59 (t, $^3J_{HH}$=6.1 Hz, 2H, CH$_2$), 2.98 (tt, $^3J_{HH}$=12.1 Hz, $^4J_{HH}$=2.9 Hz, 1H, CH), 2.31 (q, $^3J_{HH}$=5.9 Hz, 2H, CH$_2$), 1.88-1.78 (m, 4H, CH$_2$, CH), 1.46-1.36 (m, 2H, CH$_2$), 1.35-1.17 (m, 2H, CH$_2$), 1.09-0.99 (m, 9H, CH$_2$), 0.86 (t, $^3J_{HH}$=7.3 Hz, 3H, CH$_3$)

$^{13}$C NMR (101 MHz, CDCl$_3$): δ 149.0 (dd, $^1J_{CF}$=245.1 Hz, $^3J_{CF}$=10.2 Hz), 145.6 (dd, $^3J_{CF}$=8.2 Hz, $^4J_{CF}$=2.9 Hz), 141.0 (dd, $^1J_{CF}$=246.9 Hz, $^3J_{CF}$=15.3 Hz), 128.2 (dd, $^2J_{CF}$=12.5 Hz, $^3J_{CF}$=1.3 Hz), 120.3 (dd, $^2J_{CF}$=5.7 Hz, $^3J_{CF}$=4.6 Hz), 109.2 (d, $^2J_{CF}$=3.3 Hz), 67.1 (s), 40.1 (s), 36.7 (s), 33.3 (s), 33.1 (s), 32.4 (s), 31.7 (s), 31.5 (s), 27.7 (s), 23.4 (s), 14.1 (s).

Step 2: Di-tert-butyl (3-(2,3-difluoro-4-(4-pentylcyclohexyl)phenoxy)propyl)-phosphonate

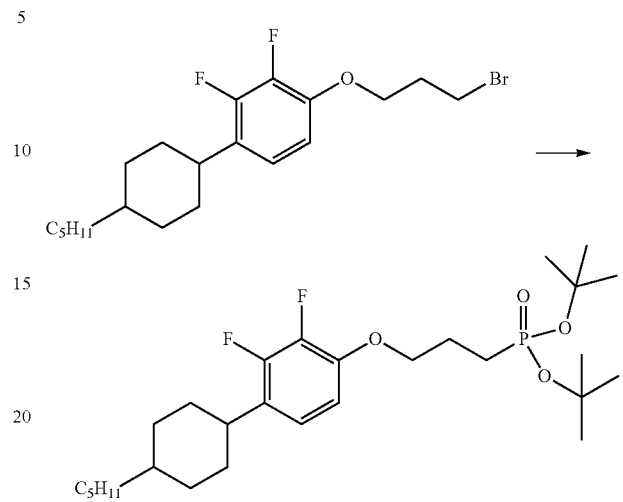

Sodium hydride (0.3 g, 7.0 mmol, 60% in mineral oil) is added in portions to a solution of di-tert-butyl phosphite (1.2 g, 1.3 ml, 6.4 mmol) in anhydrous tetrahydrofuran (THF, 50 ml) under argon. When the evolution of gas is complete, a solution of 1-(3-bromopropoxy)-2,3-difluoro-4-(4-pentylcyclohexyl)benzene (2.5 g, 6.2 mmol in 2 ml THF) is added, and the batch is left to stir at room temp. for 12 h. After aqueous work-up, the mixture is extracted with ether, the combined org. phases are dried over sodium sulfate and evaporated, and the crude product is chromatographed on silica gel with ethyl acetate, giving di-tert-butyl (3-(2,3-difluoro-4-(4-pentylcyclohexyl)phenoxy)propyl)phosphonate as a colourless solid of m.p. 47° C., decomposition point 149° C.

$^1$H NMR (400 MHz, CDCl$_3$): δ 6.77 (dd, $^3J_{HH}$=9.2 Hz, $^4J_{HF}$=2.3 Hz, 1H, H$_{Ar}$), 6.61 (dd, $^3J_{HH}$=7.33 Hz, $^4J_{HF}$=1.9 Hz, 1H, H$_{Ar}$), 4.00 (t, $^3J_{HH}$=6.1 Hz, 2H, CH$_2$) 2.56 (t, $^3J_{HH}$=11.9 Hz, 1H, CH), 2.11-1.93 (m, 3H, CH$_2$, CH), 1.87-1.73 (m, 8H, CH$_2$), 1.43 (s, 18H, CH$_3$), 1.42-1.18 (m, 10H, CH$_2$), 0.83 (t, $^3J_{HH}$=7.0 Hz, 3H, CH$_3$); $^{19}$F NMR (376 MHz, CDCl$_3$): δ −143.3 (dd, $^3J_{FF}$=19.6 Hz, $^4J_{FH}$=7.4 Hz, 1F, F$_{ar}$), −159.5 (dd, $^3J_{FF}$=18.0 Hz, $^4J_{FH}$=7.1 Hz, 1F, F$_{ar}$); 31P NMR (161 MHz, CDCl$_3$): δ 23.5 (s, 1P, P(O)(OtBu)$_2$); $^{13}$C NMR (101 MHz, CDCl$_3$): δ 149.4 (dd, $^1J_{CF}$=245.1 Hz, $^3J_{CF}$=10.2 Hz), 146.0 (dd, $^3J_{CF}$=8.2 Hz, $^4J_{CF}$=2.9 Hz), 141.5 (dd, $^1J_{CF}$=246.9 Hz, $^3J_{CF}$=15.3 Hz), 128.4 (dd, $^2J_{CF}$=12.5 Hz, $^3J_{CF}$=1.3 Hz), 120.5 (dd, $^2J_{CF}$=5.7 Hz, $^3J_{CF}$=4.6 Hz), 109.5 (d, $^2J_{CF}$=3.3 Hz), 81.6 (d, $^3J_{CP}$=8.6 Hz), 69.4 (d, $^2J_{CP}$=16.2 Hz), 37.3 (s), 37.2 (s), 37.0 (s), 33.4 (s), 33.0 (s), 32.2 (s), 30.4 (d, $^2J_{CP}$=3.9 Hz), 30.3 (s), 26.6 (s), 26.5 (d, $^1J_{CP}$=147.1 Hz), 23.6 (d, $^2J_{CP}$=5.7 Hz), 22.7 (s), 14.1 (s).

The following are prepared analogously to Example 1:

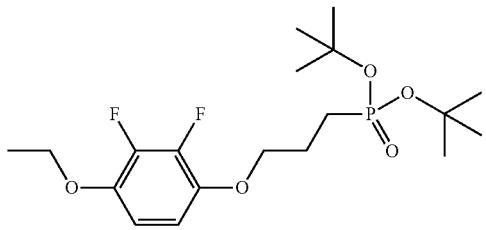

-continued
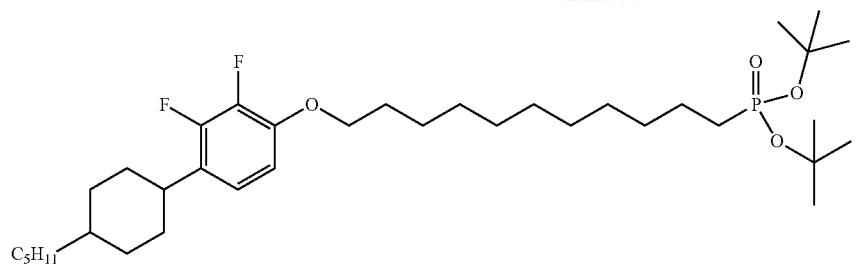
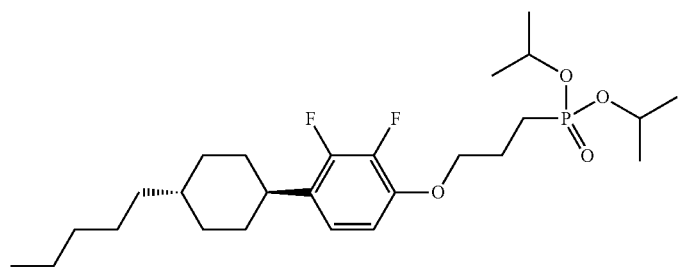
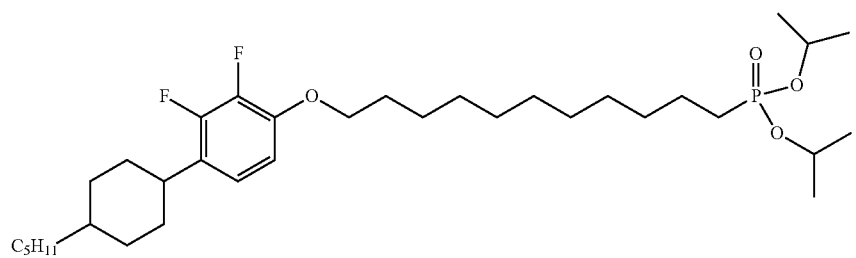
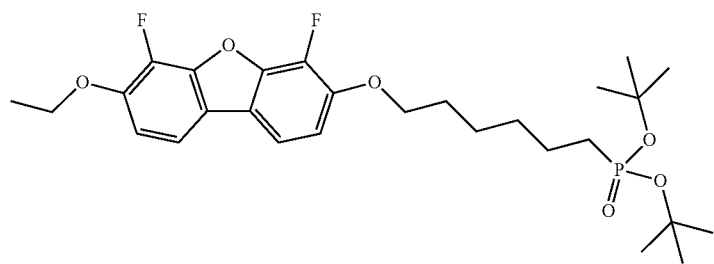
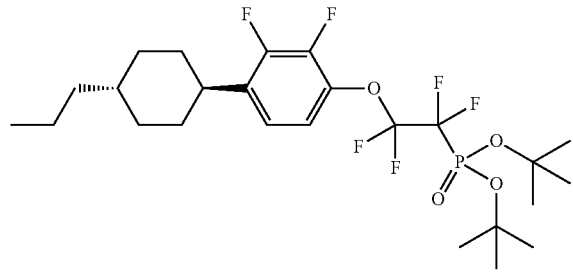
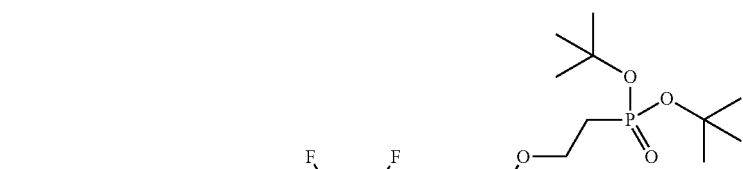
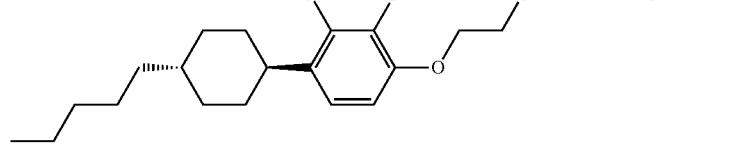

-continued
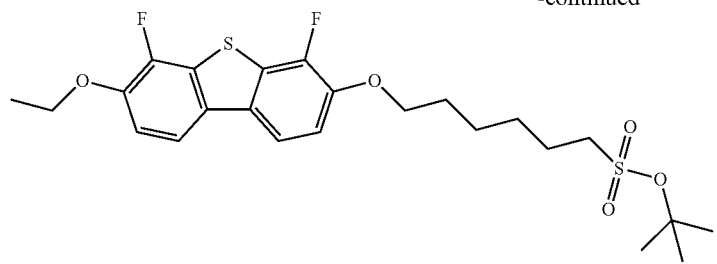
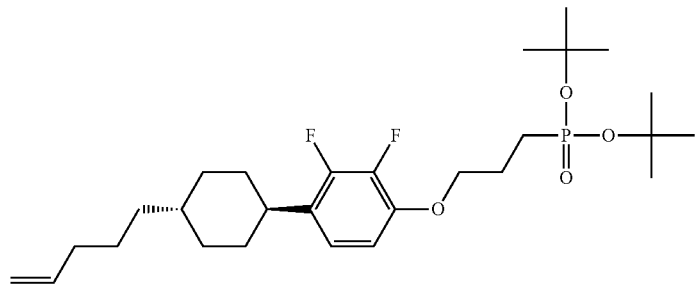
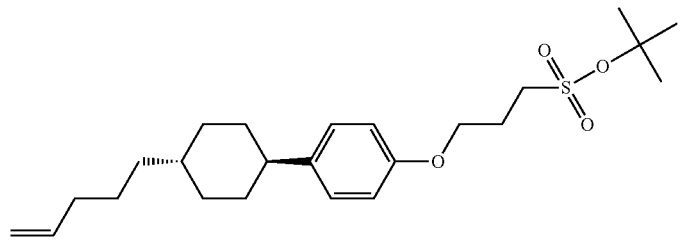
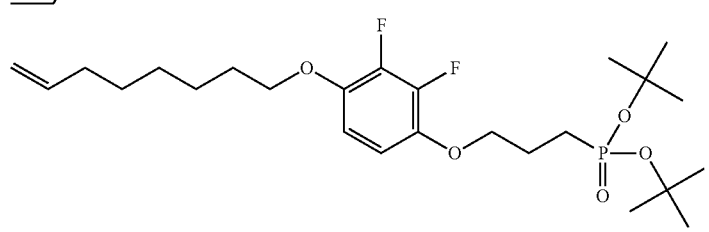
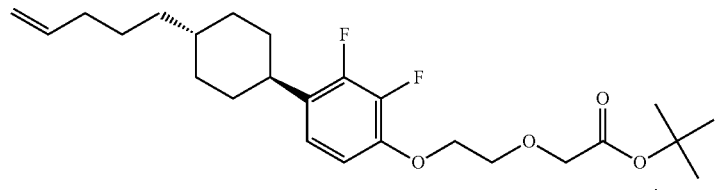
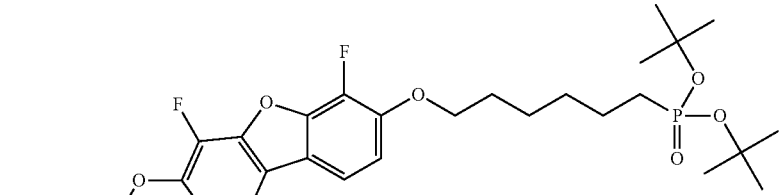
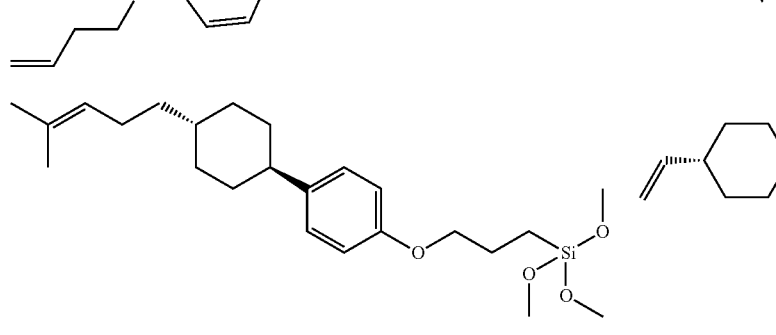
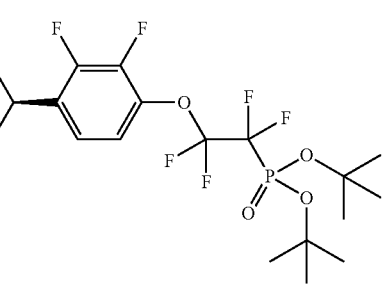

-continued

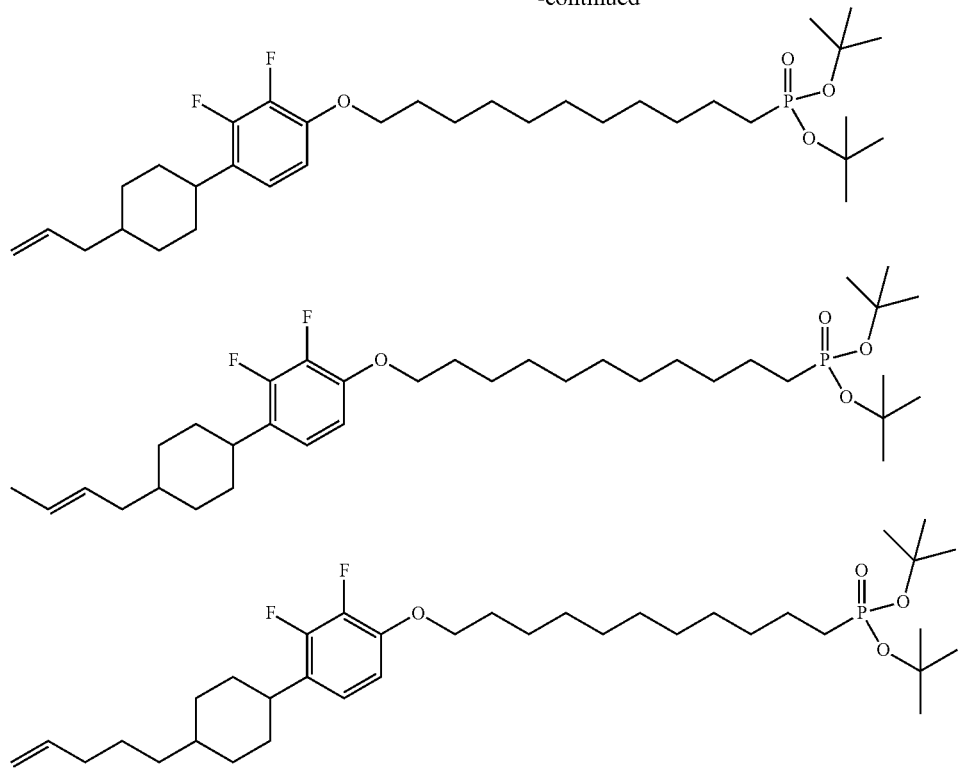

Use Examples

Preparation of an SAM by Spin Coating

Example 1: Preparation of an SAM on an Al₂O₃ Substrate

A 1-2 nm thick aluminium oxide layer is produced on a silicon wafer (8×8 mm, $p^{++}$-doped) by means of atomic layer deposition. The substrate is subsequently degreased three times with acetone in an ultrasound bath at room temperature and then cleaned in an oxygen plasma (<0.3 mbar of $O_2$, 2 min, 100 W). A 5 mM solution of the compound di-tert-butyl (3-(2,3-difluoro-4-(4-pentylcyclohexyl)phenoxy)propyl)phosphonate (Synthesis Example 1) in decalin is applied to the substrate prepared in this way by spin coating at 4000 rpm for 30 s. The substrate is subsequently annealed at 110° C. for 1 h, washed with isopropanol and dried under nitrogen.

The contact angle of water on the substrate is determined after each of the following steps:

| Wafer (substrate) before treatment: | 81° |
|---|---|
| Substrate after degreasing: | 72° |
| After plasma treatment: | 5° |
| After spin coating: | 81° |
| After drying: | 106°. |

The value of 106° measured after completion of the production process indicates the presence of a stable monolayer.

The component is characterised electrically as described in WO2018/007337 A1 on pages 72 to 75 and exhibits memristive switching behaviour.

Example 2: Production of an SAM on a $TiN_x$ Substrate

An approximately 30 nm thick titanium nitride layer is deposited on a silicon wafer (8×8 mm, $p^{++}$-doped) by sputtering. The other process steps are identical to those in Example 1.

The contact angle of water on the substrate is determined after each of the following steps:

| Wafer (substrate) before treatment: | 90° |
|---|---|
| Substrate after degreasing: | 73° |
| After plasma treatment: | 7° |
| After spin coating: | 71° |
| After drying: | 102°. |

The value of 102° measured after completion of the production process indicates the presence of a stable monolayer.

Example 3: Production of a SAM on a Glass Substrate

A glass substrate (8×8 mm) is degreased three times with isopropanol in an ultrasound bath at room temperature and then cleaned for 10 min with a freshly prepared mixture of conc. sulfuric acid and 30 percent hydrogen peroxide (3:1, "piranha solution"), washed with water and dried under nitrogen. A 0.1 mM solution of the compound di-tert-butyl (3-(2,3-difluoro-4-(4-pentylcyclohexyl)phenoxy)propyl) phosphonate (Synthesis Example 1) in decalin is applied to the substrate prepared in this way by spin coating at 4000 rpm for 30 s. The substrate is subsequently annealed at 110° C. for 1 h, washed with tetrahydrofuran and dried under nitrogen.

The contact angle of water on the substrate is determined after each of the following steps:

| | |
|---|---|
| Glass substrate before treatment: | 35° |
| Substrate after degreasing: | 15° |
| After piranha treatment: | 7° |
| After spin coating: | 25° |
| After drying: | 63°. |

The value of 63° measured after completion of the production process indicates the presence of a stable monolayer.

Example 4

A 1-2 nm thick aluminium oxide layer is produced on a silicon wafer (8×8 mm, p++-doped) by means of atomic layer deposition. The substrate is subsequently degreased three times with acetone in an ultrasound bath at room temperature and then cleaned in an oxygen plasma (<0.3 mbar of O$_2$, 1 min, 200 W). A 1 mM solution of the compound di-tert-butyl (11-(2,3-difluoro-4-(4-pentylcyclohexyl)phenoxy)undecyl)phosphonate in tetrahydrofuran is applied to the substrate prepared in this way by spin coating (application of 4 ml of solution over the course of 10 s with rotation at 150 rpm, subsequently at 3000 rpm for 35 s). The substrate is subsequently annealed at 160° C. for 1 h, washed with 10 ml of tetrahydrofuran and dried under nitrogen. The component is characterised electrically with a mercury electrode as counterelectrode as described in WO2018/007337 A1 on pages 72 to 75 and exhibits memristive switching behaviour. The current/voltage curve is shown in FIG. 1. The so-called "memory window" (MW, FIG. 1, 1) is defined as the ratio of current in the low resistance state ($I_{LRS}$) to the current in the high resistance state ($I_{HRS}$) at half the maximum voltage, MW=$I_{LRS}/I_{HRS}$ at ½ $U_{max}$ and in the case of Example 4 is MW=9·6·10$^2$.

Comparative Example 1

Figure 2:
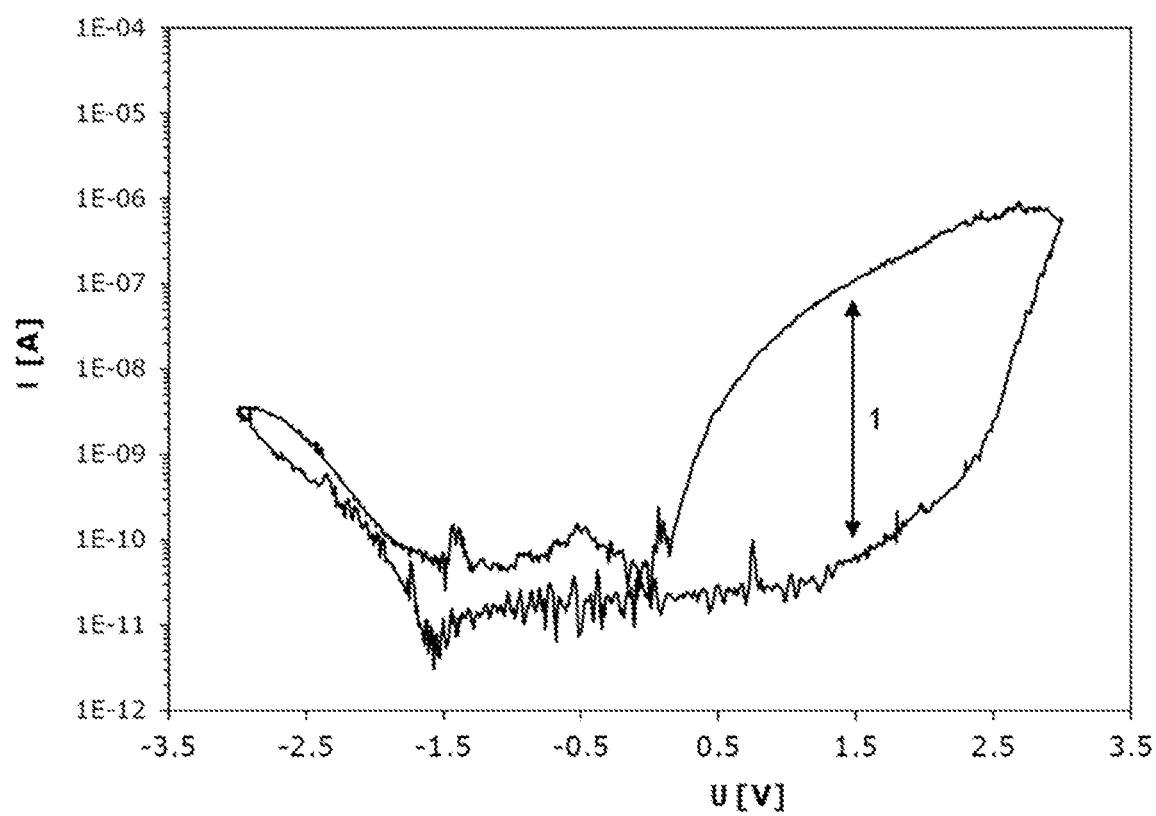
FIG. 2 shows the current/voltage curve of a component produced by dip coating with a comparative compound containing a phosphonic acid anchor group.

A substrate, produced as in Example 4, is derivatised with the free phosphonic acid corresponding to the ester from Example 4 (11-(2,3-difluoro-4-(4-pentylcyclohexyl)phenoxy)undecyl)phosphonic acid, substance example 19 from WO2018/007337 A2) by dip coating. To this end, the substrate is dipped into a 1 mM solution of this phosphonic acid in tetrahydrofuran for 72 h, subsequently dried in a stream of nitrogen, dried at 120° C. under nitrogen for 1 h, rinsed with 10 ml of tetrahydrofuran and dried again in a stream of nitrogen. The component is characterised electrically in the same way as the component from Example 4. The current/voltage curve is shown in FIG. 2. The memory window 1 is MW=1·3·10$^3$.

It can be seen that, surprisingly, the process according to the invention gives components which, within error tolerance, have the same "memory window" of MW=approx. 1000 as the components produced by the dip coating process known from the prior art.

The invention claimed is:
1. A process for production of a component, comprising:
(1) providing a substrate having a substrate surface,
(2) applying a solution comprising one or more compounds of the formula I to the substrate surface,
(3) heating the substrate to a temperature in the range from 60° C. to 300° C.,
where formula I is defined as follows:

$$R^1\text{-}(A^1\text{-}Z^1)_r\text{—}(B^1)_n\text{—}(Z^2\text{-}A^2)_s\text{-Sp-G} \qquad (I)$$

in which
R$^1$ denotes H, an alkyl or alkoxy radical having 1 to 15 C atoms, where, in addition, one or more CH$_2$ groups in these radicals may each be replaced, independently of one another, by —C≡—, —CH═CH—,

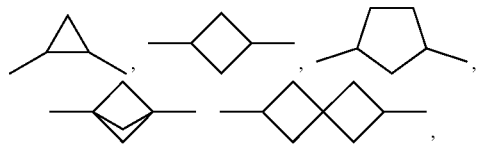

—O—, —S—, —CF$_2$O—, —OCF$_2$—, —CO—O—, —O—CO—, —SiR$^0$R$^{00}$—, —NH—, —NR$^0$— or —SO$_2$— in such a way that O atoms are not linked directly to one another, and in which, in addition, one or more H atoms may each be replaced by halogen, CN, SCN or SF$_5$, R$^0$, R$^{00}$ denote, identically or differently, an alkyl or alkoxy radical having 1 to 15 C atoms, in which, in addition, one or more H atoms may each be replaced by halogen, A$^1$, A$^2$ on each occurrence, identically or differently, denote an aromatic, heteroaromatic, alicyclic or heteroaliphatic ring having 4 to 25 ring atoms, which may also contain condensed rings and which may be mono- or polysubstituted by Y, Y on each occurrence, identically or differently, denotes F, Cl, CN, SCN, SF$_5$ or straight-chain or branched, in each case optionally fluorinated, alkyl, alkoxy, alkylcarbonyl, alkoxycarbonyl, alkylcarbonyloxy or alkoxycarbonyloxy having 1 to 12 C atoms, B$^1$ denotes

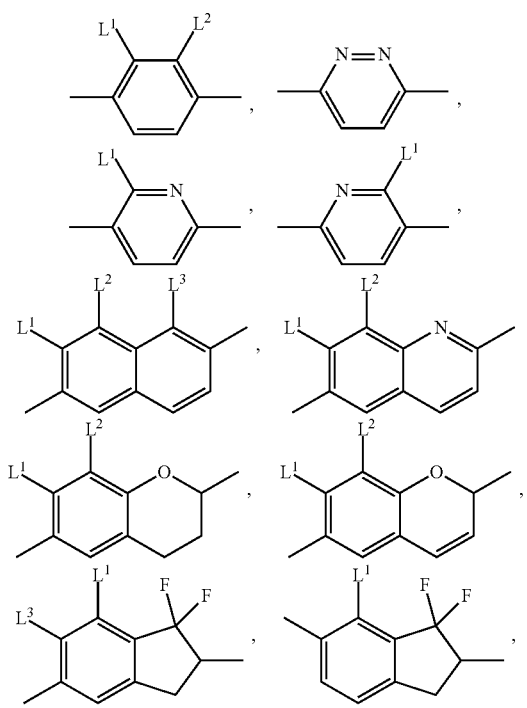

-continued

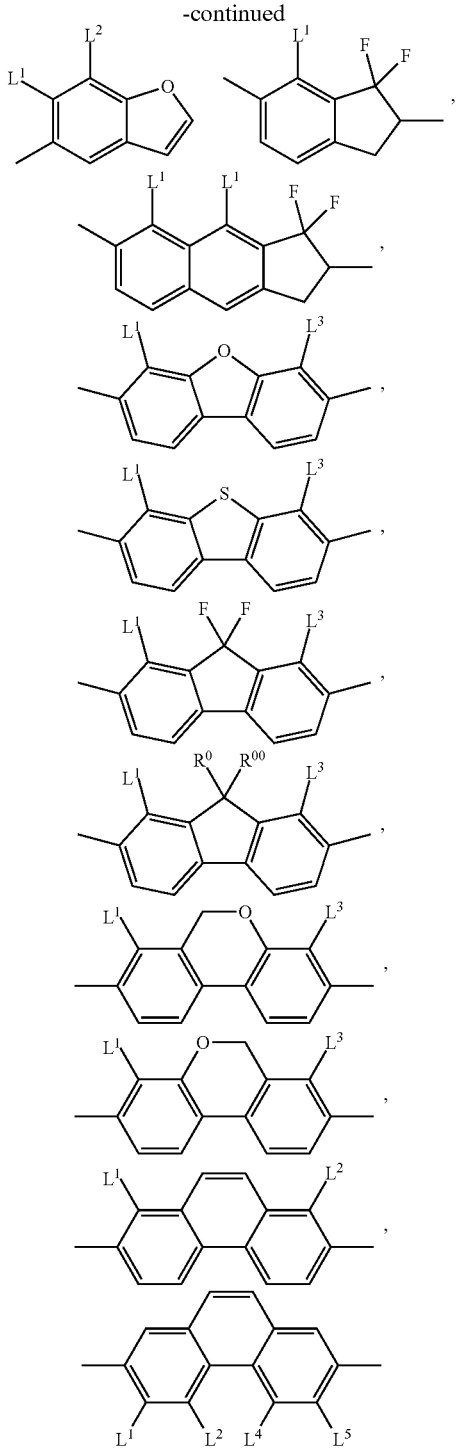

where the groups may be oriented in both directions,
$L^1$ to $L^5$ denote, independently of one another, F, Cl, Br, I, CN, $SF_5$, $CF_3$, or $OCF_3$, where $L^3$ alternatively may also denote H,
$Z^1$, $Z^2$ on each occurrence, identically or differently, denote a single bond, —$CF_2O$—, —$OCF_2$—, —$CF_2S$—, —$SCF_2$—, —$CH_2O$—, —$OCH_2$—, —C(O)O—, —OC(O)—, —C(O)S—, —SC(O)—, —$CH_2$—, —$(CH_2)_2$—, —$(CH_2)_3$—, —$(CH_2)_4$—, —$CF_2$—, —$CF_2$—, —$CF_2$—$CF_2$—, —$CF_2$—$CH_2$—, —$CH_2$—$CF_2$—, —CH═CH—, —CF═CF—, —CF═CH—, —CH═CF—, —$(CH_2)_3O$—, —$O(CH_2)_3$—, —C≡C—, —O—, —S—, —C≡N—, —N═C—, —N═N—, —N═N(O)—, —N(O)═N—, or —N═C—C═N—, Sp denotes a spacer group or a single bond, G denotes —$SO_2OR^V$, —$OP(O)(OR^V)_2$, —$PO(OR^V)_2$, —$C(OH)(PO(OR^V)_2)_2$, or —$COOR^V$, $R^V$ denotes secondary or tertiary alkyl having 3 to 20 C atoms, r and s, independently of one another, denote 0, 1, 2 or 3, where r+s≤4, and n denotes 0 or 1.

2. The process according to claim 1, where the substrate consists of a material selected from glass, metal oxide, metal nitride, metal oxynitride, element semiconductors, group III-V compound semiconductors, group II-VI compound semiconductors, metals, and conductive, oxidic materials.

3. The process according to claim 1, where the substrate consists of a material selected from Si, Ge, C, Sn, Se, GaAs, InAs, InP, GaSb, TaN, TiN, MoN, WN, GaN, CdSe, ZnS, Au, Ag, Cu, Al, W, Ta, Ti, Co, Mo, Pt, Ru, Mg, ITO, IGO, IGZO, AZO, FTO, glass, $SiO_2$, $Al_2O_3$, $TiO_2$, $HfO_2$, $ZrO_2$ $Si_3N_4$, $TaN_x$, $TiN_x$ $TiN_xO_y$, or $TaN_xO_y$.

4. The process according to claim 1, where the substrate surface has a coating consisting of a different material from the substrate.

5. The process according to claim 4, where the coating of the substrate surface consists of an oxide and/or nitride of one or more metals or semi-metals.

6. The process according to claim 1, where the solvent is removed by means of a stream of inert gas after application of the solution to a substrate.

7. The process according to claim 1, where at least one of the steps is carried out at a pressure below 1000 hPa.

8. The process according to claim 1, where the application of the solution to a substrate is carried out by spin coating.

9. The process according to claim 1, where n in formula I denotes 1.

10. A process for production of a component, the wherein production is carried out by deposition of one or more compounds of the formula I according to claim 1 from the gas phase.

11. The process according to claim 10, where the deposition is carried out at a pressure of less than 500 hPa.

12. A component for use in an electronic element containing a self-assembled monolayer, formed and set up for adoption of two switching states, where the component is produced by the process according to claim 1, with the proviso that the self-assembled monolayer is produced using one or more compounds of formula IA $$R^1\text{-}(A^1\text{-}Z^1)_r\text{—}B^1\text{—}(Z^2\text{-}A^2)_s\text{-Sp-G} \qquad (IA)$$

wherein $R^1$ denotes H, an alkyl or alkoxy radical having 1 to 15 C atoms, where, in addition, one or more $CH_2$ groups in these radicals may each be replaced, independently of one another, by, —CH═CH—,

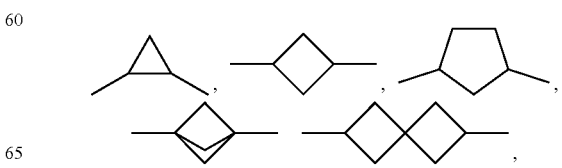

—O—, —S—, —CF$_2$O—, —OCF$_2$—, —CO—O—, —O—CO—, —SiR$^0$R$^{00}$—, —NH—, —NR$^0$— or —SO$_2$— in such a way that O atoms are not linked directly to one another, and in which, in addition, one or more H atoms may each be replaced by halogen, CN, SCN or SF$_5$, R$^0$, R$^{00}$ denote, identically or differently, an alkyl or alkoxy radical having 1 to 15 C atoms, in which, in addition, one or more H atoms may each be replaced by halogen, A$^1$, A$^2$ on each occurrence, identically or differently, denote an aromatic, heteroaromatic, alicyclic or heteroaliphatic ring having 4 to 25 ring atoms, which may also contain condensed rings and which may be mono- or polysubstituted by Y, Y on each occurrence, identically or differently, denotes F, Cl, CN, SCN, SF$_5$ or straight-chain or branched, in each case optionally fluorinated, alkyl, alkoxy, alkylcarbonyl, alkoxycarbonyl, alkylcarbonyloxy or alkoxycarbonyloxy having 1 to 12 C atoms, B$^1$ denotes

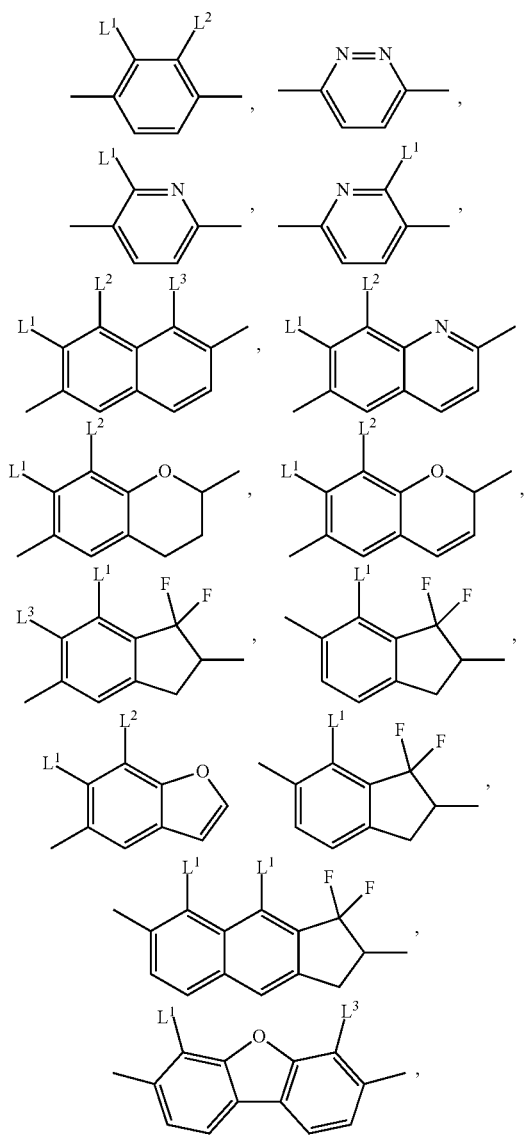

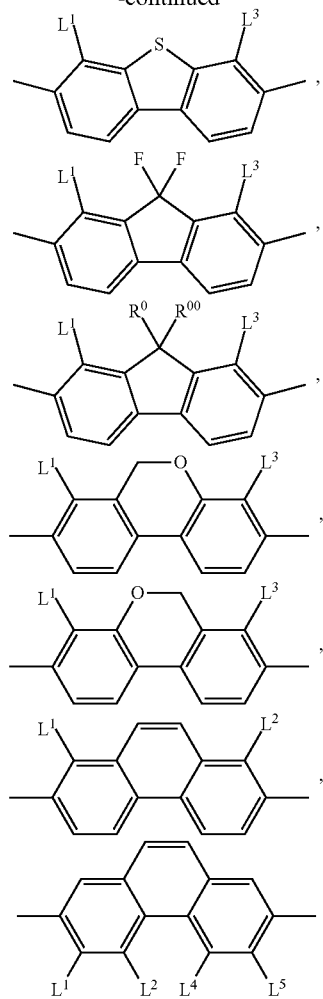

where the groups may be oriented in both directions,

L$^1$ to L$^5$ denote, independently of one another, F, Cl, Br, I, CN, SF$_5$, CF$_3$, or OCF$_3$, where L$^3$ alternatively may also denote H, Z$^1$, Z$^2$ on each occurrence, identically or differently, denote a single bond, —CF$_2$O—, —OCF$_2$—, —CF$_2$S—, —SCF$_2$—, —CH$_2$O—, —OCH$_2$—, —C(O)O—, —OC(O)—, —C(O)S—, —SC(O)—, —CH$_2$—, —(CH$_2$)$_2$—, —(CH$_2$)$_3$—, —(CH$_2$)$_4$—, —CF$_2$—, —CF$_2$—CF$_2$—, —CF$_2$—CH$_2$—, —CH$_2$—CF$_2$—, —CH=CH—, —CF=CF—, —CF=CH—, —CH=CF—, —(CH$_2$)$_3$O—, —O(CH$_2$)$_3$—, —O—, —S—, —C=N—, —N=C—, —N=N—, —N=N(O)—, —N(O)=N—, or —N=C—C=N—, Sp denotes a spacer group or a single bond, G denotes —SO$_2$OR$^V$, —OP(O)(OR$^V$)$_2$, —PO(OR$^V$)$_2$, —C(OH)(PO(OR$^V$)$_2$)$_2$, or —COOR$^V$, R$^V$ denotes secondary or tertiary alkyl having 3 to 20 C atoms, r and s, independently of one another, denote 0, 1, 2 or 3, and where r+s<4.

13. The component according to claim 12, where the one or more compounds of the formula IA are selected from the compounds of the formulae

| | |
|---|---|
| R¹-B¹-Sp-G | IAa |
| R¹-(A¹-Z¹)-B¹-Sp-G | IAb |
| R¹-(A¹-Z¹)₂-B¹-Sp-G | IAc |
| R¹-B¹-(Z²-A²)-Sp-G | IAd |
| R¹-B¹-(Z²-A²)₂-Sp-G | IAe |
| R¹-(A¹-Z¹)-B¹-(Z²-A²-)-Sp-G | IAf | in which $R^1$, $A^1$, $A^2$, $B^1$, $Z^1$, $Z^2$, Sp and G have the meanings indicated in claim 12.

14. The component according to claim 13, where the one or more compounds of the formula IA are selected from the compounds of the formulae IAa, IAb, and IAd.

15. The component according to claim 12,
where the material for production of the self-assembled monolayer comprises one or more compounds of the formula Ig $$R^2\text{-G} \qquad \text{Ig}$$

in which
$R^2$ has the meaning indicated for $R^1$ in claim 12 and
G has the meaning indicated in claim 12.

16. The component according to claim 15,
where the one or more compounds of the formula Ig are selected from the compounds of the formulae Ig-1 to Ig-3

$$CH_3(CH_2)_r\text{-G} \qquad \text{Ig-1}$$

$$CF_3(CF_2)_sCH_2CH_2\text{-G} \qquad \text{Ig-2}$$

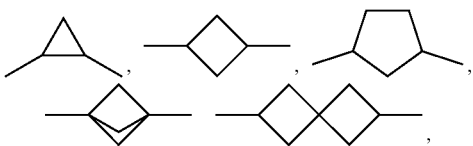

Ig-3 in which
G denotes —PO(OR$^V$)₂ or —SO₂OR$^V$,
R$^V$ denotes secondary or tertiary alkyl having 3 to 20 C atoms,
r denotes an integer from 1 to 20,
s denotes an integer from 1 to 18, and
t denotes an integer from 1 to 4.

17. A memristive electronic switching element comprising the component according to claim 12.

18. A compound of formula IA $$R^1\text{-}(A^1\text{-}Z^1)_r\text{—}B^1\text{—}(Z^2\text{-}A^2)_s\text{-Sp-G} \qquad (IA)$$

in which
$R^1$ denotes H, an alkyl or alkoxy radical having 1 to 15 C atoms, where, in addition, one or more CH₂ groups in these radicals may each be replaced, independently of one another, by —C≡C—, —CH=CH—,

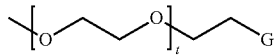

—O—, —S—, —CF₂O—, —OCF₂—, —CO—O—, —O—CO—, —SiR⁰R⁰⁰—, —NH—, —NR⁰— or —SO₂— in such a way that O atoms are not linked directly to one another, and in which, in addition, one or more H atoms may each be replaced by halogen, CN, SCN or SF₅, $R^0$, $R^{00}$ denote, identically or differently, an alkyl or alkoxy radical having 1 to 15 C atoms, in which, in addition, one or more H atoms may each be replaced by halogen, $A^1$, $A^2$ on each occurrence, identically or differently, denote an aromatic, heteroaromatic, alicyclic or heteroaliphatic ring having 4 to 25 ring atoms, which may also contain condensed rings and which may be mono- or polysubstituted by Y, Y on each occurrence, identically or differently, denotes F, Cl, CN, SCN, SF₅ or straight-chain or branched, in each case optionally fluorinated, alkyl, alkoxy, alkylcarbonyl, alkoxycarbonyl, alkylcarbonyloxy or alkoxycarbonyloxy having 1 to 12 C atoms, $B^1$ denotes

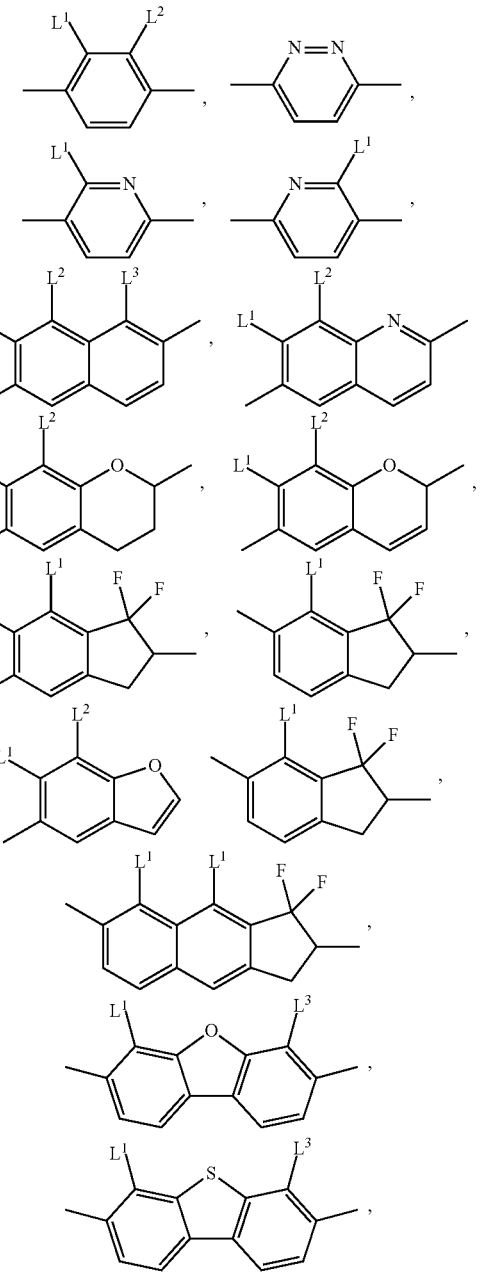

53
-continued

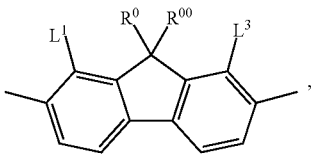

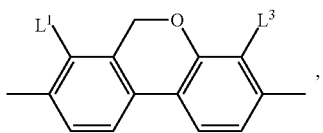

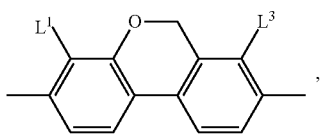

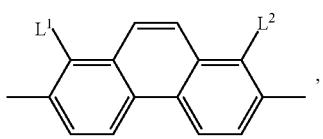

54
-continued

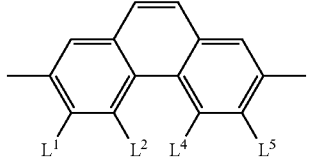

where the groups may be oriented in both directions,
$L^1$ to $L^5$ denote, independently of one another, F, Cl, Br, I, CN, $SF_5$, $CF_3$, or $OCF_3$, where $L^3$ alternatively may also denote H, $Z^1$, $Z^2$ on each occurrence, identically or differently, denote a single bond, $-CF_2O-$, $-OCF_2-$, $-CF_2S-$, $-SCF_2-$, $-CH_2O-$, $-OCH_2-$, $-C(O)O-$, $-OC(O)-$, $-C(O)S-$, $-SC(O)-$, $-CH_2-$, $-(CH_2)_2-$, $-(CH_2)_3-$, $-(CH_2)_4-$, $-CF_2-$, $-CF_2-CF_2-$, $-CF_2-CH_2-$, $-CH_2-CF_2-$, 13 $CH=CH-$, $-CF=CF-$, $-CF=CH-$, $-CH=CF-$, $-(CH_2)_3O-$, $-O(CH_2)_3-$, $-C\equiv C-$, $-O-$, $-S-$, $-C=N-$, $-N=C-$, $-N=N-$, $-N=N(O)-$, $-N(O)=N-$, or $-N=C-C=N-$, Sp denotes a spacer group or a single bond, G denotes $-SO_2OR^V$, $-OP(O)(OR^V)_2$, $-PO(OR^V)_2$, $-C(OH)(PO(OR^V)_2)_2$, or $-COOR^V$, $R^V$ denotes secondary or tertiary alkyl having 3 to 20 C atoms, r and s, independently of one another, denote 0, 1, 2 or 3, where r+s<4.

19. The compound according to claim 18, in which
G denotes $-SO_2OR^V$ or $-PO(OR^V)_2$, and
$R^V$ denotes an isopropyl or tert-butyl radical.

20. The compound according to claim 18, wherein said compound is selected from the following compounds:

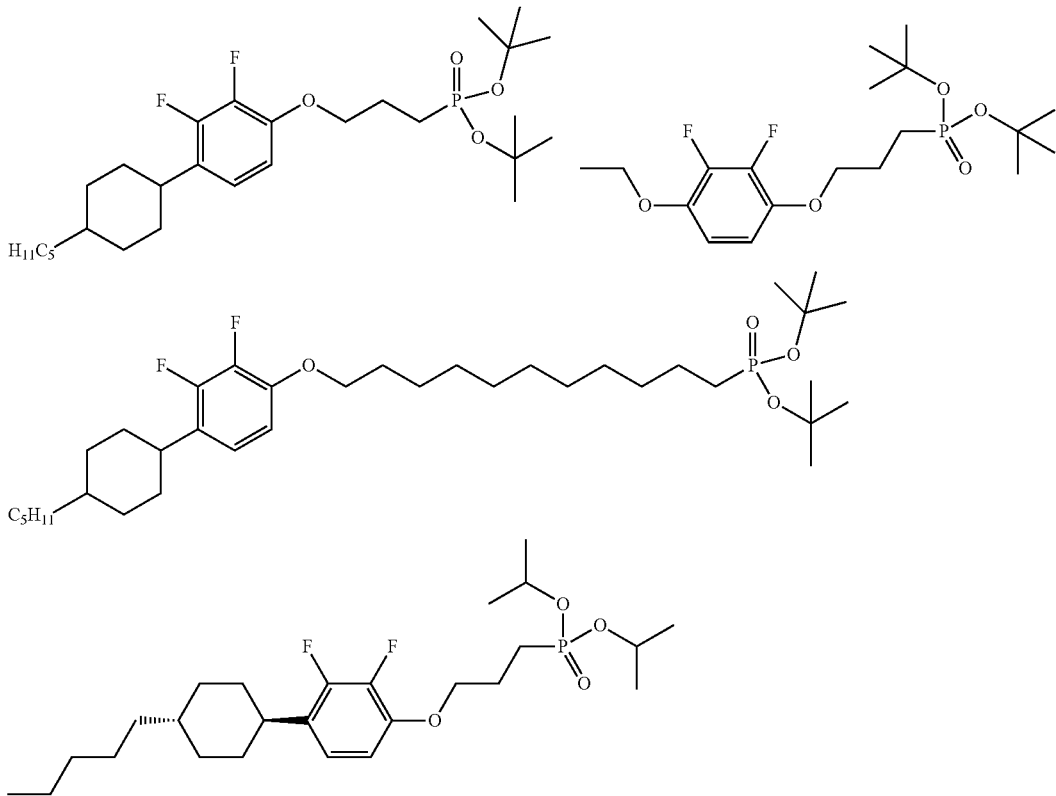

-continued
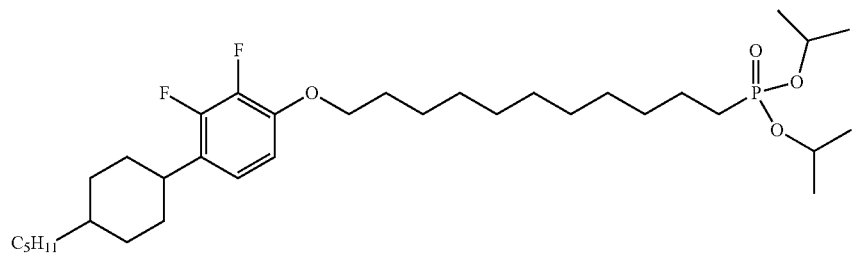
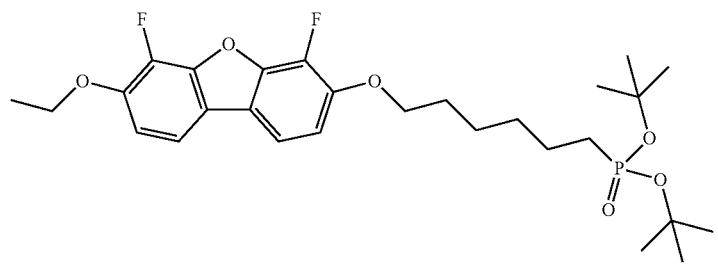
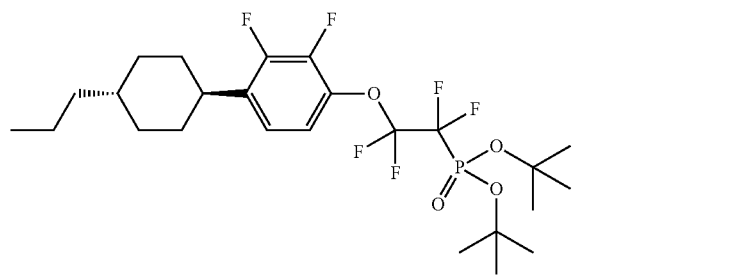
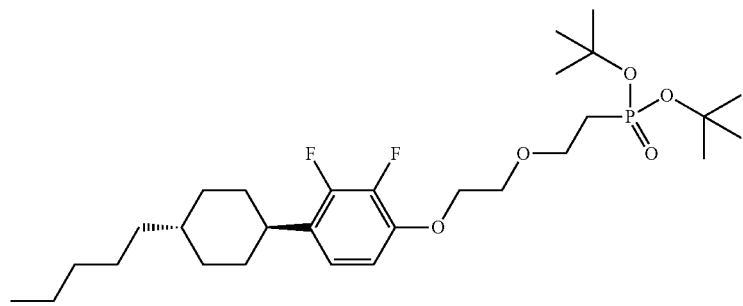
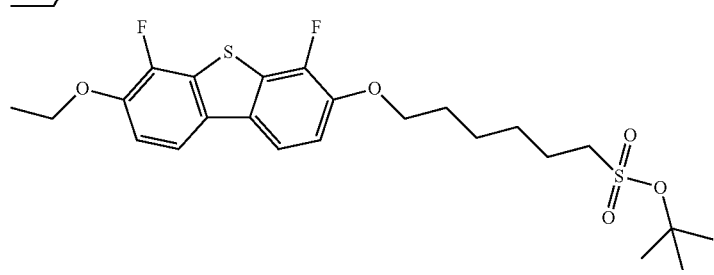
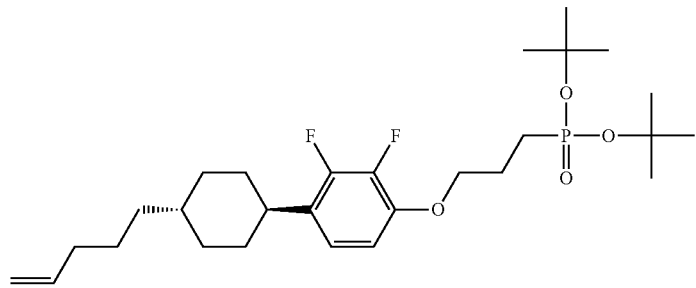

-continued
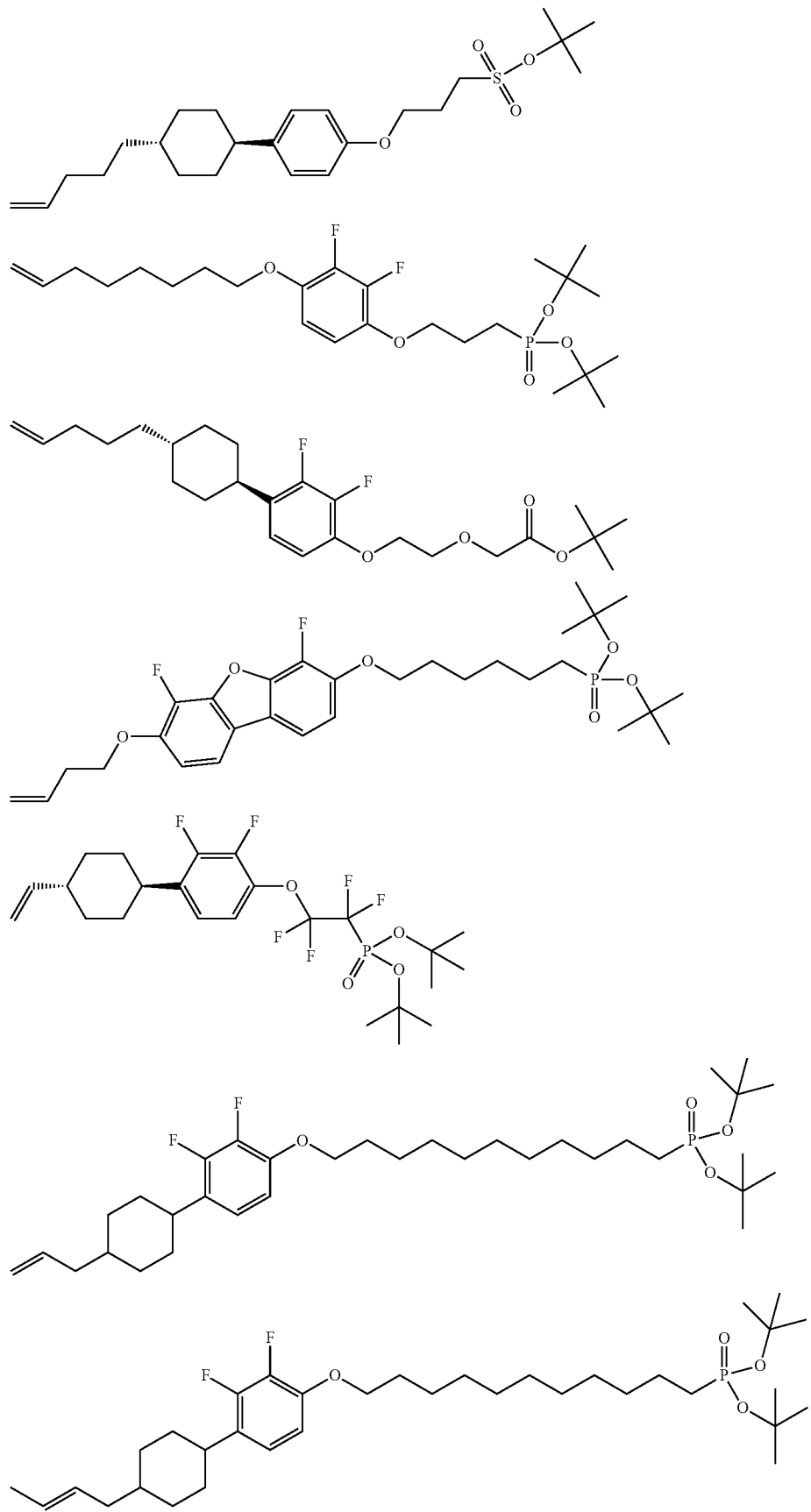

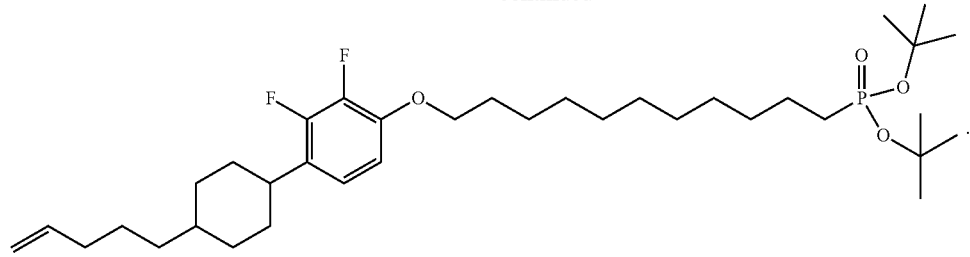
* * * * *